US011830876B2

(12) United States Patent
Fulford et al.

(10) Patent No.: US 11,830,876 B2
(45) Date of Patent: Nov. 28, 2023

(54) THREE-DIMENSIONAL DEVICE WITH SELF-ALIGNED VERTICAL INTERCONNECTION

(71) Applicant: Tokyo Electron Limited, Tokyo (JP)

(72) Inventors: H. Jim Fulford, Marianna, FL (US); Mark I. Gardner, Cedar Creek, TX (US); Partha Mukhopadhyay, Jacksonville, FL (US)

(73) Assignee: Tokyo Electron Limited, Tokyo (JP)

( * ) Notice: Subject to any disclaimer, the term of this patent is extended or adjusted under 35 U.S.C. 154(b) by 120 days.

(21) Appl. No.: 17/451,415

(22) Filed: Oct. 19, 2021

(65) Prior Publication Data

US 2022/0344332 A1 Oct. 27, 2022

Related U.S. Application Data

(60) Provisional application No. 63/180,434, filed on Apr. 27, 2021.

(51) Int. Cl.
| | | |
|---|---|---|
| *H01L 27/092* | (2006.01) | |
| *H01L 21/8238* | (2006.01) | |
| *H01L 23/528* | (2006.01) | |
| *H01L 29/78* | (2006.01) | |

(52) U.S. Cl.
CPC .... *H01L 27/092* (2013.01); *H01L 21/823871* (2013.01); *H01L 23/528* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 2015/0236038 A1* | 8/2015 | Pachamuthu | H01L 27/0688 257/326 |
| 2021/0028111 A1* | 1/2021 | Kai | H10B 43/27 |
| 2021/0210504 A1* | 7/2021 | Otsu | H10B 43/27 |

* cited by examiner

*Primary Examiner* — Hsien Ming Lee
(74) *Attorney, Agent, or Firm* — Oblon, McClelland, Maier & Neustadt, L.L.P.

(57) ABSTRACT

According to an aspect of the disclosure, a semiconductor device is provided. The semiconductor device includes a stack of insulating layers and interconnect layers that are positioned alternatingly over a substrate. The semiconductor device includes a channel structure extending from the substrate and further through the insulating layers and the interconnect layers. The channel structure includes a first channel section positioned over the substrate and coupled to a first group of the interconnect layers, and a second channel section positioned over the first channel section and coupled to a second group of the interconnect layers. The semiconductor device also includes a plurality of contact structures extending from and coupled to the interconnect layers in a staircase configuration such that each of the plurality of contact structures extends from a respective interconnect layer.

20 Claims, 32 Drawing Sheets

THREE-DIMENSIONAL DEVICE WITH SELF-ALIGNED VERTICAL INTERCONNECTION

CROSS REFERENCE TO RELATED APPLICATIONS

This present application claims the benefit of priority to U.S. Provisional Application No. 63/180,434 filed on Apr. 27, 2021, which is incorporated by reference herein in its entirety.

FIELD OF THE INVENTION

The disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY 3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Techniques herein include methods and devices for 3D fabrication of semiconductor devices. Specifically, techniques include self-aligned metal routing achieved with 360 degree symmetry for 3D vertical transistors. Excellent compact circuit layout can be obtained with the disclosure. Techniques herein can be used for any geometry device (for example, circular, rectangular, ellipse). Example embodiments include an N=8 3D stack, but other embodiments can have N devices to be connected with 3D wiring, where N can be any positive integer. High density circuit formation can be enabled in part because devices are grown vertically.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The semiconductor device can include a stack of insulating layers and interconnect layers that are positioned alternatingly over a substrate. The semiconductor device can include a channel structure extending from the substrate and further through the insulating layers and the interconnect layers. The channel structure can include a first channel section positioned over the substrate and coupled to a first group of the interconnect layers, and a second channel section positioned over the first channel section and coupled to a second group of the interconnect layers. The semiconductor device can also include a plurality of contact structures extending from and coupled to the interconnect layers in a staircase configuration such that each of the plurality of contact structures extends from a respective interconnect layer.

The first channel section can further include a first S/D region formed over the substrate, and a first gate region formed over the first S/D region. The first gate region can include a first channel region over the first S/D region and a first gate oxide around the first channel region. The first channel section can include a second S/D region over the first gate region.

The first group of the interconnect layers can include a first interconnect layer, a second interconnect layer, and a third interconnect layer. The first interconnect layer can be in contact with the first S/D region of the first channel section and over the substrate. The second interconnect layer can be in contact with the first gate oxide of the first gate region of the first channel region and over the first interconnect layer. The third interconnect layer can be in contact with the second S/D region of the first channel section and over the second interconnect layer.

In some embodiments, the first S/D region, the first channel region, and the second S/D region of the first channel section can include one of a p-type semiconductor material and a n-type semiconductor material.

The second channel section can include a third S/D region formed over the second S/D region of the first channel section, and a second gate region formed over the third S/D region. The second gate region can include a second channel region over the third S/D region and a second gate oxide around the second channel region. The second channel section can also include a fourth S/D region over the second gate region.

The second group of the interconnect layers can include a fourth interconnect layer, a fifth interconnect layer, and a sixth interconnect layer. The fourth interconnect layer can be in contact with the third S/D region of the second channel section and over the third interconnect layer. The fifth interconnect layer can be in contact with the second gate oxide of the second gate region and over the fourth interconnect layer. The sixth interconnect layer can be in contact with the fourth S/D region of the second channel section and over the fifth interconnect layer.

In some embodiments, the third S/D region, the second channel region, and the fourth S/D region of the second channel section can include one of a p-type semiconductor material and a n-type semiconductor material.

The channel structure can further include a first dielectric layer positioned between the substrate and the first S/D region of the first channel section, a second dielectric layer positioned between the second S/D region of the first channel section and the third S/D region of the second channel section, and a third dielectric layer positioned over the fourth S/D region of the second channel section.

The channel structure can include an isolation structure extending from the first dielectric layer and further through the first channel section, the second dielectric layer, the second channel section, and the third dielectric layer.

The semiconductor device can include a plurality of spacers extending from the interconnect layers and positioned between the plurality of contact structures such that the plurality of spacers and the plurality of contact structures are disposed alternatingly along a direction parallel to the substrate.

According to another aspect of the disclosure, a method for fabricating a semiconductor device is provided. In the method, a channel structure can be formed on a substrate, where the channel structure can extend from the substrate and further through a stack of alternating insulating layers and interconnect layers that are positioned over the substrate. The channel structure can be channels of field effect transistors that have a current flow path perpendicular to a surface of the substrate. A plurality of bilayer dielectric structures can be formed to extend from the interconnect layers in a staircase configuration such that each of the plurality of bilayer dielectric structures extends from a respective interconnect layer along a direction perpendicular to the substrate. Each of the bilayer dielectric structures can include a respective first dielectric layer and a respective second dielectric layer such that the first dielectric layers and the second dielectric layers in the plurality of bilayer dielectric structures can be disposed alternatingly along a direction parallel to the substrate. Further, a plurality of contact structures can be formed by replacing the second dielectric layers with a conductive material. The contact structures can extend from and coupled to the interconnect layers in a staircase configuration such that each of the plurality of contact structures extends from a respective interconnect layer.

In order to form the plurality of bilayer dielectric structures, a first opening can be formed in the stack adjacent to the channel structure. The first opening can include sidewalls and a bottom to uncover a first interconnect layer of the stack. A first bilayer dielectric structure of the plurality of bilayer dielectric structures can be formed that includes side portions along the sidewalls of the first opening and a bottom portion over the first interconnect layer. The bottom portion of the first bilayer dielectric structure, and the first interconnect layer and a first insulating layer underlying the first interconnect layer in the first opening can be etched to form a second opening that includes sidewalls along the first bilayer dielectric structure and a bottom to uncover a second interconnect layer underlying the first insulating layer. A second bilayer dielectric structure can be formed that include side portions along the sidewalls of the second opening and a bottom portion over the second interconnect layer. The bottom portion of the second bilayer dielectric structure, and the second interconnect layer and a second insulating layer underlying the second interconnect layer in the second opening can be etched to form a third opening that includes sidewalls along the second bilayer dielectric structure and a bottom to uncover a third interconnect layer underlying the second insulating layer. A third bilayer dielectric structure can be formed that includes side portions along the sidewalls of the third opening and a bottom portion over the third interconnect layer. The bottom portion of the third bilayer dielectric structure can further be removed.

In order to form the plurality of contact structures, the second dielectric layers can be replaced in the first, second, and third bilayer dielectric structures with the conductive material to form a first contact structure, a second contact structure, and a third contact structure of the plurality of contact structures respectively.

In order to form the channel structure, a bottom dielectric layer can be formed over the substrate, a first channel section can be formed over the bottom dielectric layer, a middle dielectric layer can be formed over the first channel section, a second channel section can be formed over the middle dielectric layer, and a top dielectric layer can be formed over the second channel section.

In some embodiments, the first channel section can include a first S/D region formed over the bottom dielectric layer and in contact with the third interconnect layer, and a first gate region formed over the first S/D region. The first gate region can include a first channel region over the first S/D region and a first gate oxide that is around the first channel region and in contact with the second interconnect layer. The first channel section can also include a second S/D region over the first gate region and in contact with the first interconnect layer.

In some embodiments, the second channel section can include a third S/D region formed over the second S/D region of the first channel section, and a second gate region formed over the third S/D region, where the second gate region can include a second channel region over the third S/D region and a second gate oxide around the second channel region. The second channel section can include a fourth S/D region over the second gate region.

According to yet another aspect of the disclosure, a method for fabricating a semiconductor device is provided. In the method, a channel structure can be formed on a substrate, where the channel structure can extend from the substrate and further through a stack of alternating insulating layers and interconnect layers that are positioned over the substrate. The channel structure can be channels of field effect transistors that have a current flow path perpendicular to a surface of the substrate. A plurality of dielectric structures can be formed to extend from the interconnect layers in a staircase configuration such that each of the dielectric structures can extend from a respective interconnect layer along a direction perpendicular to the substrate. A plurality of contact openings can be formed in the plurality dielectric structures such that each of the plurality of contact openings uncovers a respective interconnect layer of the interconnect layers. A plurality of contact structures can be formed by filling the plurality of contact openings with a conductive material. The contact structures can extend from and coupled to the interconnect layers in a staircase configuration such that each of the plurality of contact structures extends from a respective interconnect layer.

In order to form the plurality of dielectric structures, a first opening can be formed in the stack adjacent to the channel structure, where the first opening can include sidewalls and a bottom to uncover a first interconnect layer of the stack. A first dielectric structure of the plurality of dielectric structures can be formed that includes side portions along the sidewalls of the first opening and a bottom portion over the first interconnect layer. The bottom portion of the first dielectric structure, and the first interconnect layer and a first insulating layer underlying the first interconnect layer in the first opening can be etched to form a second opening that includes sidewalls along the first dielectric structure and a bottom to uncover a second interconnect layer underlying the first insulating layer. A second dielectric structure can be formed that includes side portions along the sidewalls of the second opening and a bottom portion over the second interconnect layer. The bottom portion of the second dielectric structure, and the second interconnect layer and a second insulating layer underlying the second interconnect layer in the second opening can further be etched to form a third opening that includes sidewalls along the second dielectric structure and a bottom to uncover a third interconnect layer underlying the second insulating layer. A third dielectric structure can be subsequently formed that includes side portions along the sidewalls of the third opening and a bottom portion over the third interconnect layer. The bottom portion of the third dielectric structure can further be removed.

In some embodiments, a first contact opening of the plurality of contact openings can be formed in the first dielectric structure that uncover the first interconnect layer. A second contact opening of the plurality of contact openings can be formed in the second dielectric structure that uncover the second interconnect layer. A third contact opening of the plurality of contact openings can be formed in the third dielectric structure that uncover the third interconnect layer.

In order to form the channel structure, a bottom dielectric layer can be formed over the substrate, a first channel section can be formed over the bottom dielectric layer, a middle dielectric layer can be formed over the first channel section, a second channel section can be formed over the middle dielectric layer, and a top dielectric layer can be formed over the second channel section. The first channel section can include a first S/D region formed over the bottom dielectric layer and in contact with the third interconnect layer, and a first gate region formed over the first S/D region. The first gate region can include a first channel region over the first S/D region and a first gate oxide that is around the first channel region and in contact with the second interconnect layer. The first channel section can also include a second S/D region over the first gate region and in contact with the first interconnect layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
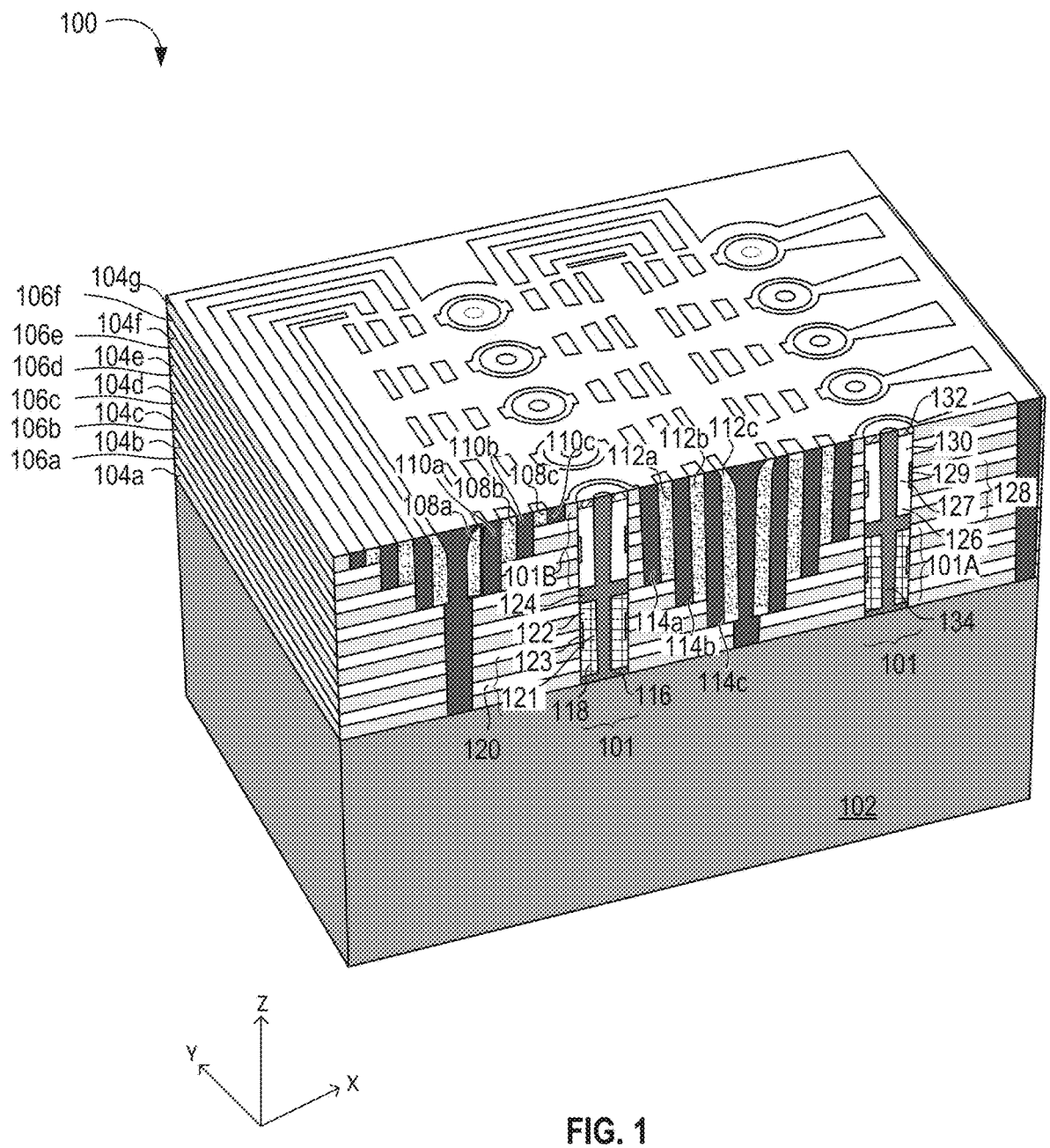
FIG. 1 is a perspective view of a first semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques herein include methods of self-aligned metal routing that are achieved with 360 degree symmetry for 3D vertical transistors. Excellent compact circuit layout can be obtained with the disclosure. Techniques herein can be used for any geometry device (for example, circular, rectangular, and ellipse). Example embodiments include an N=8 3D stack, but other embodiments can have N devices to be connected with 3D wiring, where the N can be any positive integer. High density circuit formation can be enabled in part because devices are grown vertically. Efficient new 3D process flow herein enables reduced masking steps with precise control of the vertical silicon channel thickness and 3D isolation. Embodiments include metal self-aligned to 3D source, gate, and drain on any semiconductor substrate for N vertical devices. The self-aligned dual dielectric flow herein can complete the metal wiring connections on multiple 3D levels without a contact mask.

Embodiments of the disclosure can be described with reference to the figures as follows. FIG. 1 shows an exemplary semiconductor device (or device) 100 according to some embodiments of the disclosure. FIGS. 2A, 2B, 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, and 22 are top-down views, cross-sectional views, and perspective views of various intermediate steps in a manufacturing flow to fabricate the device 100, in accordance with some embodiments.

As shown in FIG. 1, the semiconductor device (or device) 100 can include a substrate 102 on which a stack of insulating layers 104 and interconnect layers 106 that are positioned alternatingly over the substrate 102. A plurality of channel structures 101 can extend from the substrate 102 and further through the insulating layers 104 and the interconnect layers 106. Each of the channel structures 101 can include a first channel section 101A positioned over the substrate 102 and coupled to a first group of the interconnect layers 106, and a second channel section 101B positioned over the first channel section 101A and coupled to a second group of the interconnect layers 106. The device 100 can also include a plurality of contact structures (e.g., 108 and 112) extending from and coupled to the interconnect layers 106 in a staircase configuration such that each of the plurality of contact structures extends from a respective interconnect layer. The device 100 can include a plurality of spacers 110 that extending from the interconnect layers 106 and positioned between the plurality of contact structures (e.g., 108 and 112) such that the plurality of spacers 110 and the plurality of contact structures are disposed alternatingly along a direction (e.g., X direction) parallel to the substrate 102. For example, the spacers 110a-110c and the contact structures 108a-108c can be arranged alternatingly along the X direction, where the spacer 110a and the contact structure 108a can extend from the interconnect layer 106d, the spacer 110b and the contact structure 108b can extend from the interconnect layer 106e, and the spacer 110c and the contact structure 108c can extend from the interconnect layer 106f.

In an exemplary embodiment of FIG. 1, seven insulating layers 104a-104g, six interconnect layers 106a-106f, and two channel structures 101 are provided. However, FIG. 1 is merely an example, and any numbers of insulating layers, interconnect layers, and channel structures can be included in the device 100 according to the design of the device.

In some embodiments, the substrate 102 may be a semiconductor substrate such as Si substrate. The substrate 102 may also include other semiconductors such as germanium (Ge), silicon carbide (SiC), silicon germanium (SiGe), or diamond. Alternately, the substrate 102 may include a compound semiconductor and/or an alloy semiconductor. By way of example, in some embodiments, the substrate 102 may also include silicon phosphide (SiP), silicon phosphorus carbide (SiPC), a silicon-on-insulator (SOI) structure, a SiGe-on-SOI structure, a Ge-on-SOI structure, a III-VI materials, or a combination of any of the above materials. The insulating layers can include SiO, SiN, SiC, SiCN, SiCON, SiON, or the like. The interconnect layers can include polysilicon, W, Ru, Co, Cu, Al, or the like.

The first channel section 101A can further include a first S/D region 118 formed over the substrate 102, and a first gate region 120 formed over the first S/D region 118. The first gate region 120 can include a first channel region 121 over the first S/D region 118 and a first gate oxide 123 around the first channel region 121. The first channel section 101A can also include a second S/D region 122 over the first gate region 120.

The first group of the interconnect layers can include the interconnect layers 106a-106c that are coupled to the first channel section 101A. For example, the interconnect layer 106a can be in contact with the first S/D region 118 of the first channel section 101A and over the substrate 102. The interconnect layer 106b can be in contact with the first gate oxide 123 of the first gate region 120 of the first channel section 101A and over the interconnect layer 106a. The interconnect layer 106c can be in contact with the second S/D region 122 of the first channel section 101A and over the interconnect layer 106b.

In an embodiment, the first S/D region 118, the first channel region 121, and the second S/D region 122 of the first channel section 101A can be made of a p-type semiconductor material. Accordingly, the first channel section 101A can function as a p-type transistor. In another embodiment, the first S/D region 118, the first channel region 121, and the second S/D region 122 of the first channel section 101A can be made of a n-type semiconductor material. Accordingly, the first channel section 101A can function as a n-type transistor.

The second channel section 101B can include a third S/D region 126 formed over the second S/D region 122 of the first channel section 101A, and a second gate region 128 formed over the third S/D region 126. The second gate region 128 can include a second channel region 127 over the third S/D region 126 and a second gate oxide 129 around the second channel region 127. The second channel section 101B can also include a fourth S/D region 130 over the second gate region 128.

In an embodiment, the third S/D region 126, the second channel region 127, and the fourth S/D region 130 of the second channel section 101B can be made of a p-type semiconductor material. Accordingly, the second channel section 101B can function as a p-type transistor. In another embodiment, the third S/D region 126, the second channel region 127, and the fourth S/D region 130 of the second channel section 101B can be made of a n-type semiconductor material. Accordingly, the second channel section 101B can function as a n-type transistor.

The second group of the interconnect layers can include the interconnect layers 106d-106f that are in contact with and coupled to the second channel section 101B. The interconnect layer 106d can be in contact with the third S/D region 126 of the second channel section 101B and over the interconnect layer 106c. The interconnect layer 106e can be in contact with the second gate oxide 129 of the second gate region 128 and over the interconnect layer 106d. The interconnect layer 106f can be in contact with the fourth S/D region 130 of the second channel section 101B and over the interconnect layer 106e.

Still referring to FIG. 1, the channel structure 101 can further include a bottom dielectric layer 116 positioned between the substrate 102 and the first S/D region 118 of the first channel section 101A, a middle dielectric layer 124 positioned between the second S/D region 122 of the first channel section 101A and the third S/D region 126 of the second channel section 101B, and a top dielectric layer 132 positioned over the fourth S/D region 130 of the second channel section 101B. The channel structure can include an isolation structure 134 extending from the bottom dielectric layer 116 and further through the first channel section 101A, the middle dielectric layer 124, the second channel section 101B, and the top dielectric layer 132.

In some embodiments, the bottom dielectric layer 116, the middle dielectric layer 124, and the isolation structure 134 can be made of a same dielectric material, such as SiO, SiN, SiC, SiCN, SiCON, SiON, or the like. In some embodiments, the bottom dielectric layer 116, the middle dielectric layer 124, and the isolation structure 134 can include different dielectric materials. In some embodiments, the top dielectric layer 132 can be made of a different dielectric material from the bottom dielectric layer 116 and the middle dielectric layer 124. In some embodiments, the top dielectric layer 132 can include a same dielectric material as the bottom dielectric layer 116 and the middle dielectric layer 124.

Figure 2A:
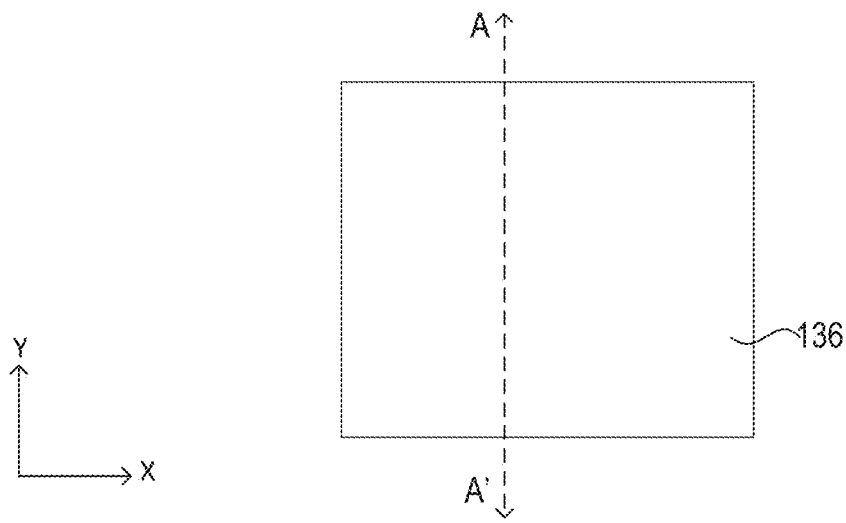
FIGS. 2A, 2B, 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, and 22 are top-down views, cross-sectional views, and perspective views of various intermediate steps in a manufacturing flow to fabricate the first semiconductor device, in accordance with some embodiments.
Figure 2B:
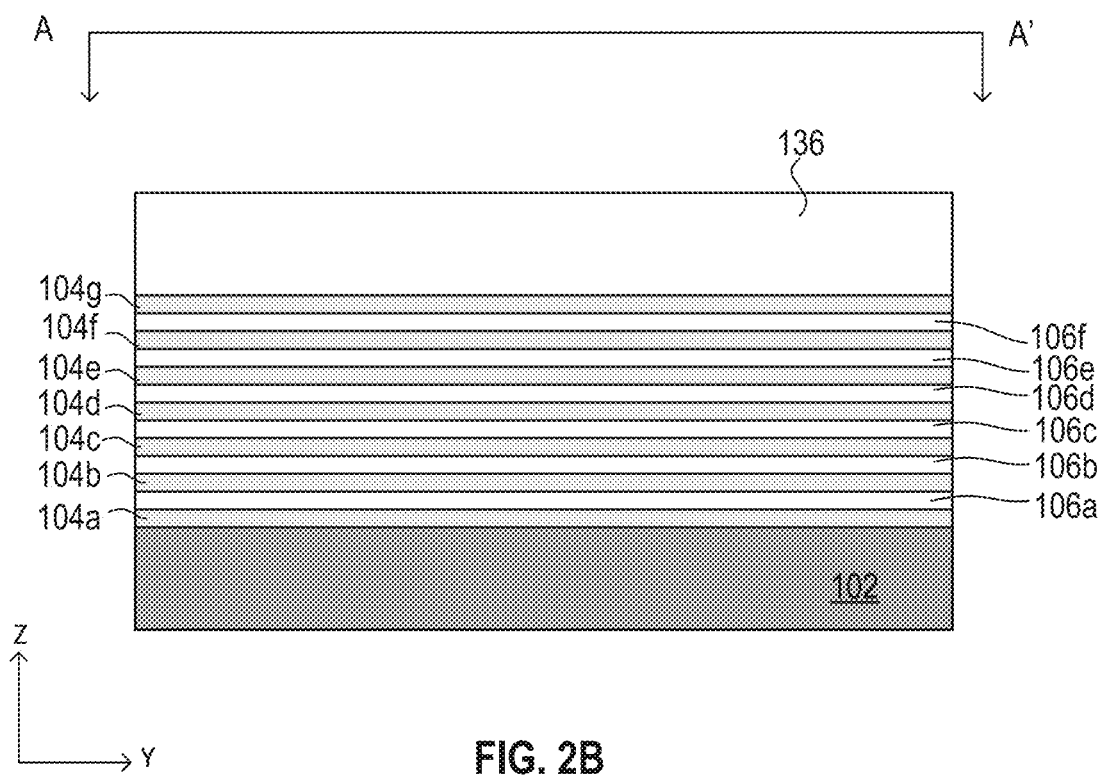

Beginning with FIGS. 2A and 2B, an exemplary device fabrication process is provided to describe a 3D metal interconnection that is self-aligned to a 3D vertical transistor stack, where the 3D metal interconnection can have a height of N devices and be self-aligned to S/D regions and gate electrodes of the 3D vertical transistor stack with a 360 rotational symmetry. Accordingly, a 3D compact routing device fabrication can be obtained in the disclosure. FIG. 2A shows a top down view. FIG. 2B is a cross-sectional view and obtained from a plane same as the vertical plane containing line A-A' in FIG. 1A. As shown in FIGS. 2A and 2B, a layer stack (or a stack) can be formed on a substrate. The layer stack can include alternating insulating layer 104 and interconnect layers 106. A cap layer 136 can be deposited over the stack and formed of a different dielectric material from the insulating layers 104. The cap layer 136 can be a thicker layer compared to the insulating layers 104. As mentioned above, the insulating layers 104 can include SiO, SiN, SiC, SiCN, SiCON, SiON, or the like. The interconnect layers 106 can include polysilicon, W, Ru, Co, Cu, Al, or the like. The insulating layers 104, the interconnect layers 106, and the cap layer 136 can be formed by a suitable deposition process, such as a chemical vapor deposition (CVD), a physical vapor deposition (PVD), an atomic layer deposition (ALD), a thermal oxidation, an e-beam evaporation, a sputtering, a diffusion, or any combination thereof.

Figure 3A:
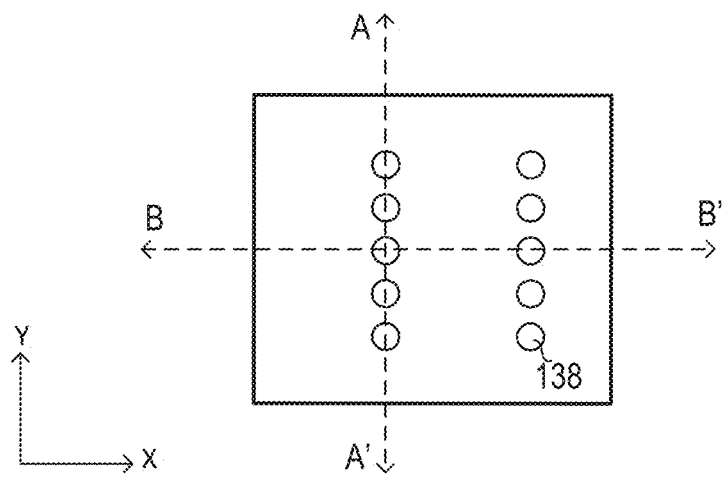
Figure 3B:
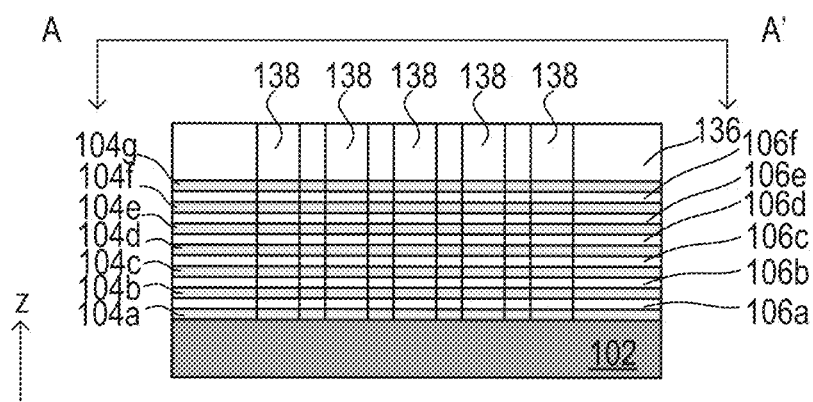
Figure 3C:
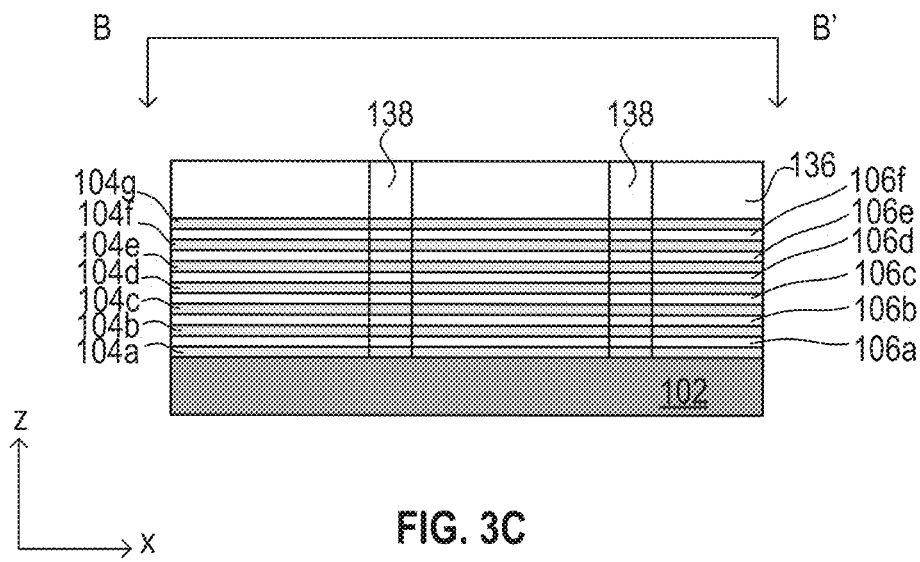

In FIGS. 3A, 3B, and 3C, a plurality of channel holes 138 can be formed. FIG. 3A is a top down view. FIG. 3B is a cross-sectional view and obtained from a plane same as the vertical plane containing line A-A' in FIG. 3A. FIG. 3C is a cross-sectional view and obtained from a plane same as the vertical plane containing line B-B' in FIG. 3A. As shown in FIGS. 3A, 3B, and 3C, the channel holes 138 can extend from the substrate 102 and through the stack of the insulating layers 104 and the interconnect layers 106. In order to form the channel holes 138, an etch mask (not shown) can be formed on the stack and then a directional etch process can be executed that etches through the stack until the substrate 102 is uncovered.

Figure 4A:
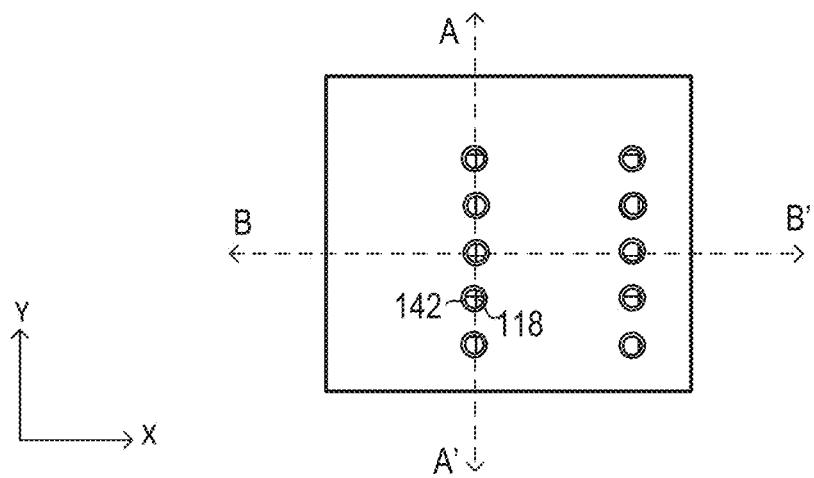
Figure 4B:
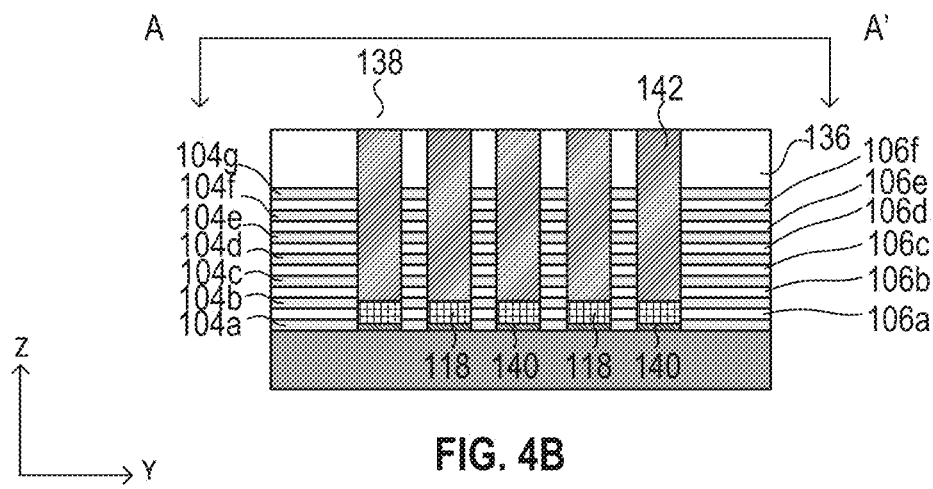
Figure 4C:
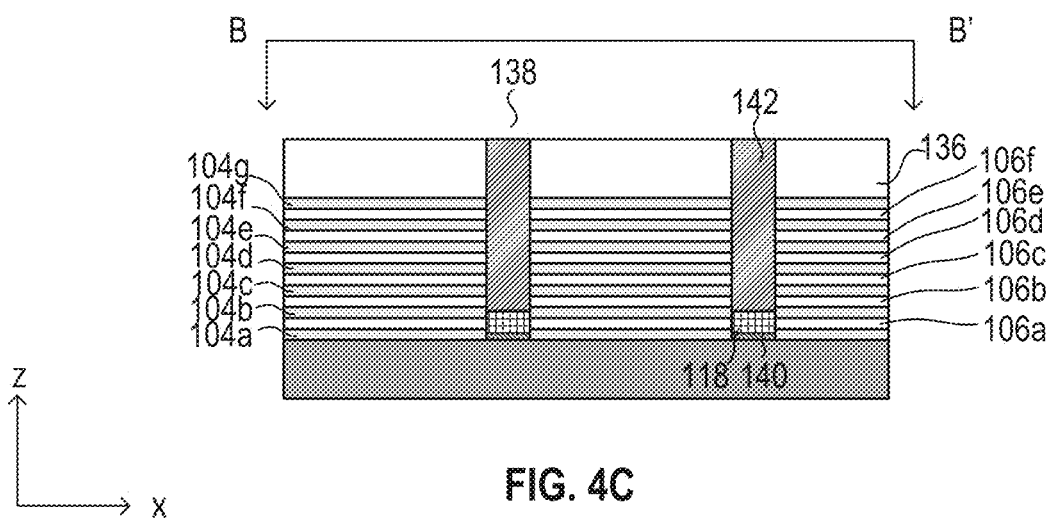

In FIGS. 4A, 4B, and 4C, bottom layers (e.g., SiGe layers) 140 and semiconductor layers 118 (e.g., a p-type silicon) can be grown at bottoms of the channel holes 138 sequentially. In some embodiments, the semiconductor layers 118 can function as first S/D regions 118. Then a high-k dielectric 142 can be deposited by a deposition process, such as the atomic layer deposition, on sidewalls of the channel holes 138. It should be noted that an anisotropic etch can further be performed to remove the high-k dielectric 142 that is positioned on a top surface of the stack. In addition, the semiconductor layers 118 can be positioned to cross the interconnect layer 106a and between the insulating layers 104a and 104b so that the interconnect layer 106a is in contact with the semiconductor layers 118. The high-k dielectric 142 can include $HfO_2$, $ZrO_2$, $HfSiNO_2$, $ZrSiNO_2$, $Y_3O_4$, $Si_3N_4$, $Al_2O_3$, $SiO_2$, or the like.

Figure 5A:
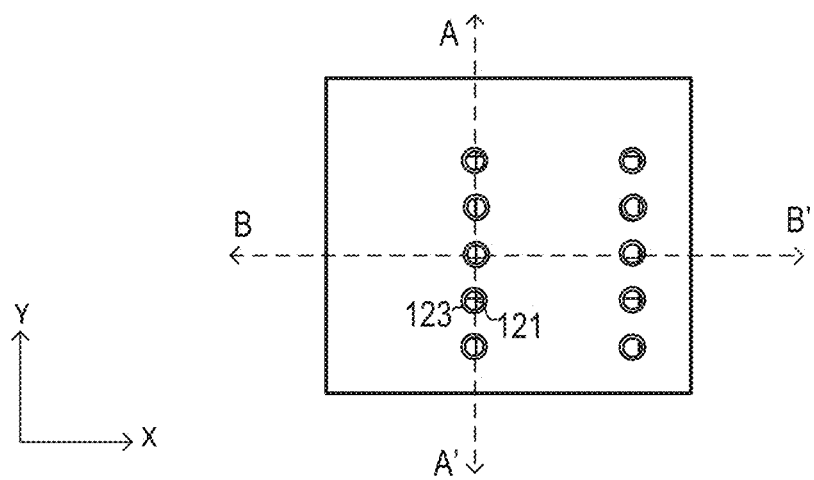
Figure 5B:
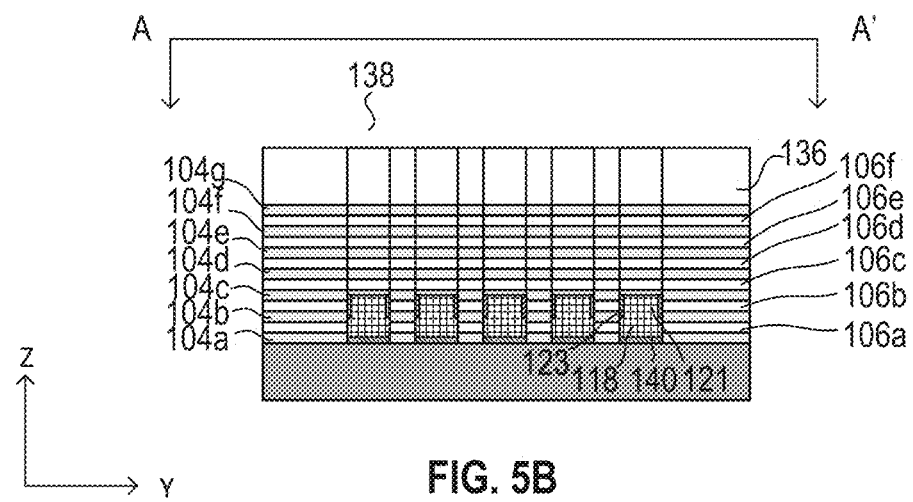
Figure 5C:
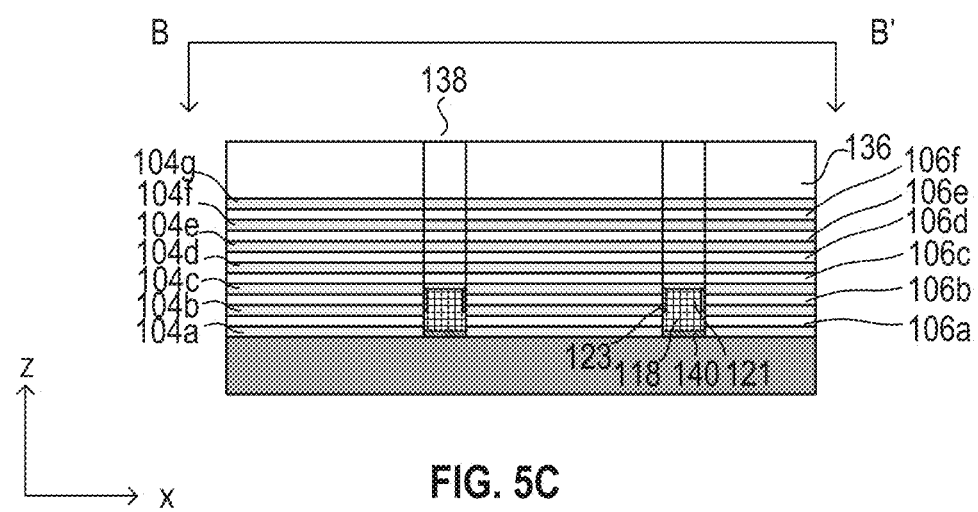

In FIGS. 5A, 5B, and 5C, semiconductor layers 121 can be deposited to cross another interconnect layer, such as 106b, so as to be positioned between the insulating layers 104b and 104c. In some embodiments, the semiconductor layers 121 can function as first channel regions 121. Then an isotropic etch can be executed to remove a portion of the high-k dielectric 142 that is positioned above the semiconductor layers 121. The high-k dielectric 142 that remains in the channel holes 138 becomes first gate oxides 123. The first gate oxides 123 and the first channel regions 121 can form the first gate regions 120, which can be identical to the first gate regions 120 in FIG. 1.

Figure 6A:
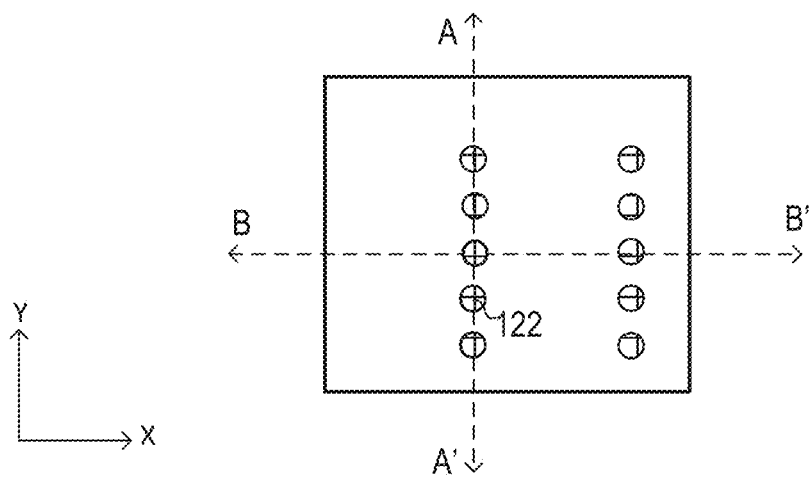
Figure 6B:
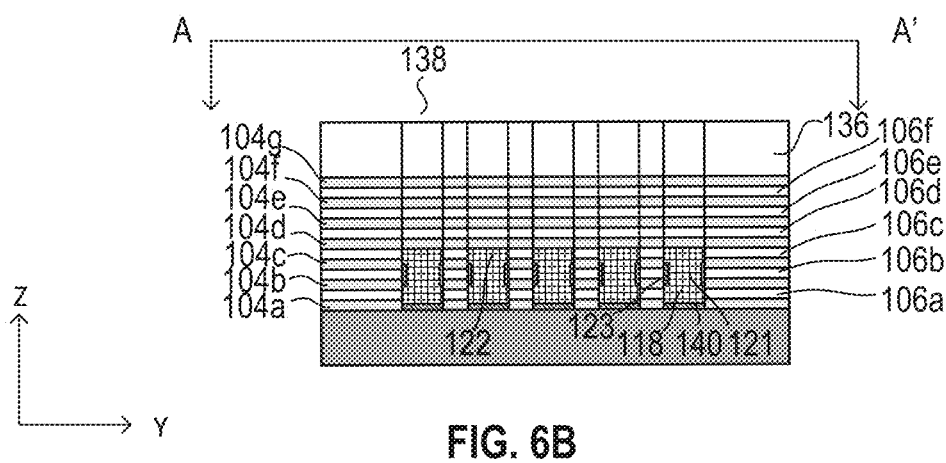
Figure 6C:
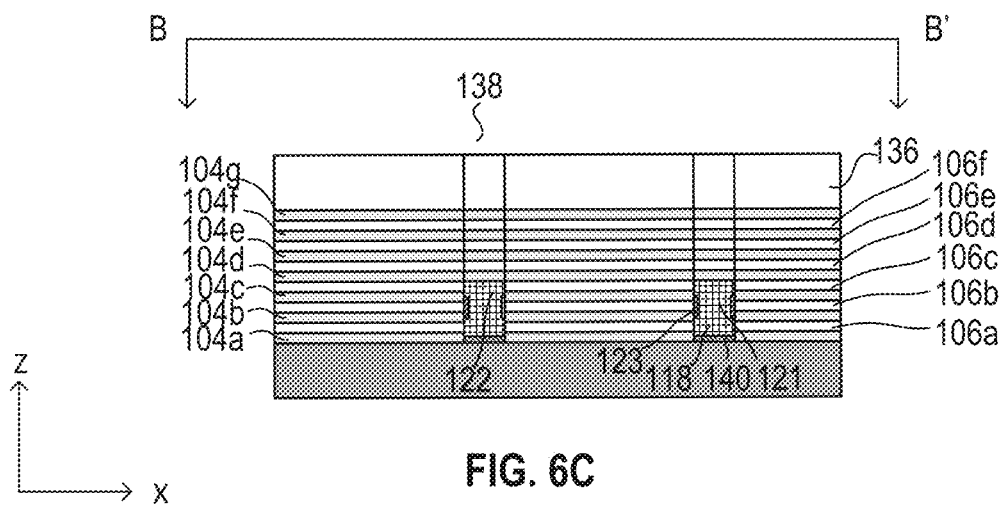

In FIGS. 6A, 6B, and 6C, semiconductor layers 122 can be formed, such as by an epitaxial growth process, over the semiconductor layers 121. In some embodiments, the semiconductor layers 122 can function as second S/D regions 122 which are shown in FIG. 1. It should be noted that the semiconductor layers 122 are arranged between the insulating layers 104c and 104d, and in contact with the interconnect layer 106c.

Figure 7A:
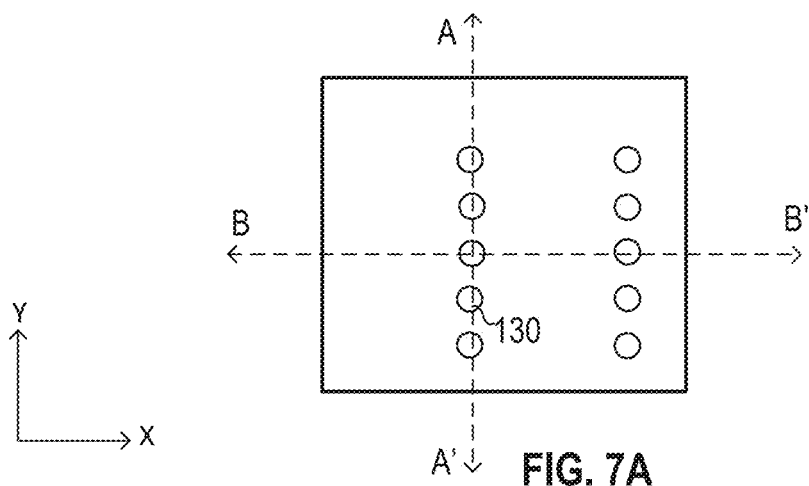
Figure 7B:
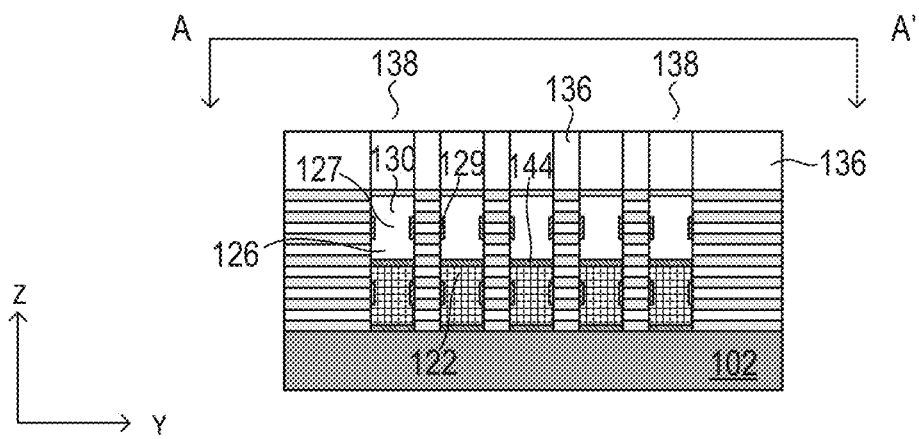
Figure 7C:
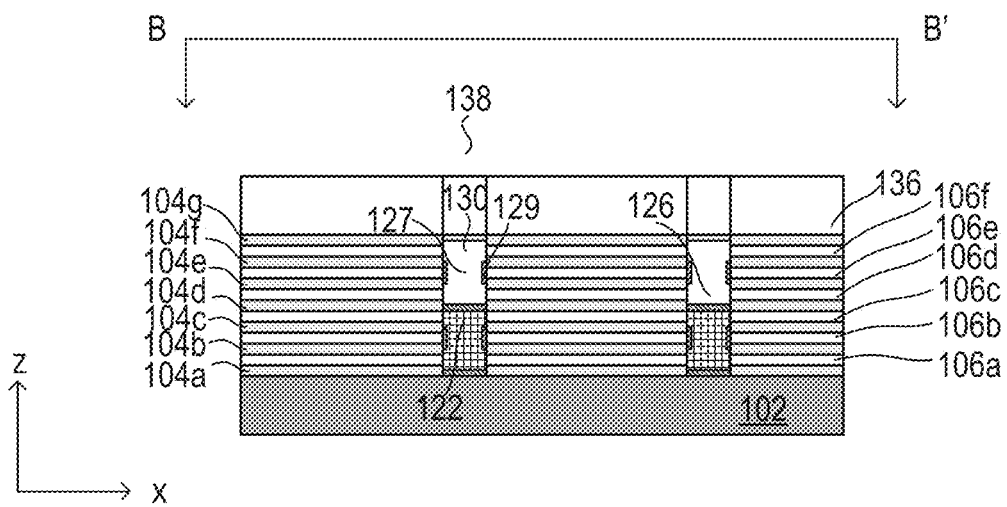

In FIGS. 7A, 7B, and 7C, SiGe layers 144 can be epitaxially grown as transition points and disposed over the semiconductor layers 122. Followed is the formation of the semiconductor layers 126 over the SiGe layers 144, which can function as third S/D regions 126. Similar to the steps illustrated in FIGS. 4A, 4B, 4C, 5A, 5B, 5C, 6A, 6B, and 6C, semiconductor layers 127 can be formed over the semiconductor layers 126. The semiconductor layers 127 can function as second channel regions 127, and surrounded by second gate oxides 129. The semiconductor layers 127 and the second gate oxides 129 can form second gate regions 128 which can be identical to the second gate regions 128 in FIG. 1. Further, semiconductor layers 130 can be formed over the semiconductor layers 127 and function as fourth S/D regions 130. In some embodiments, the semiconductor layers 126, 127, and 130 can be made of n-type doped silicon. The third S/D regions 126, the second gate regions 128, and the fourth S/D regions 130 can form the second channel sections 101B that are shown in FIG. 1.

Figure 8A:
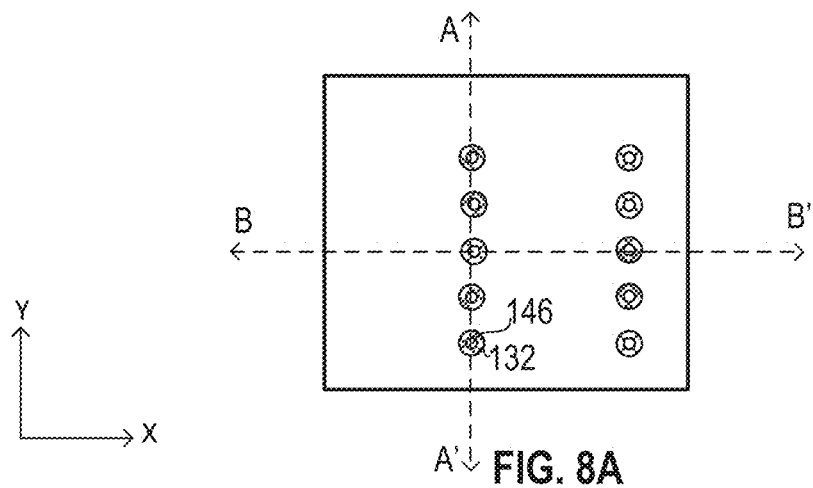
Figure 8B:
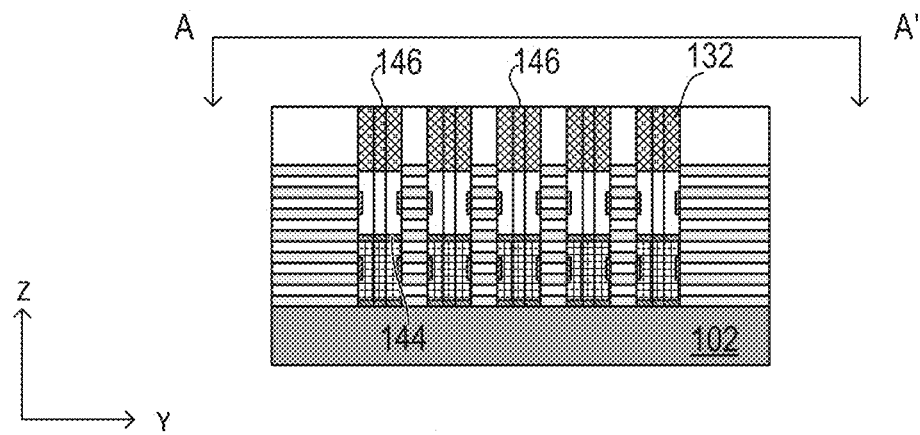
Figure 8C:
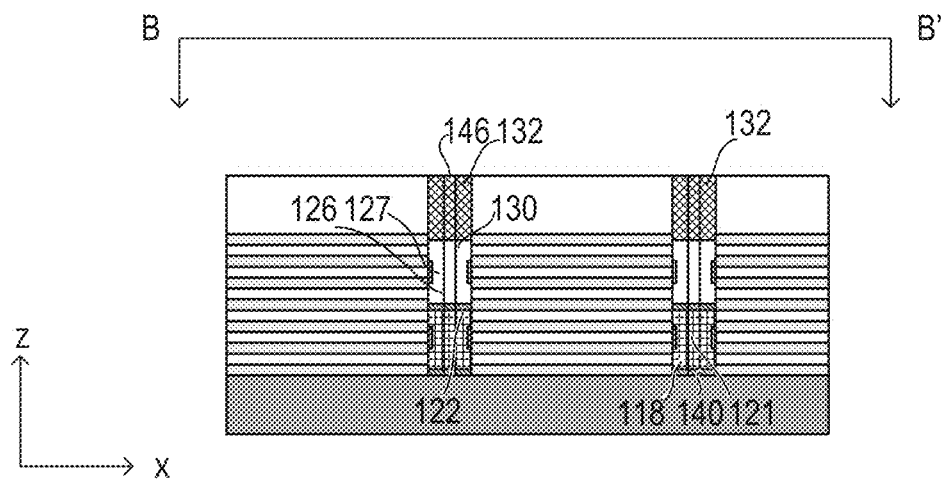

In FIGS. 8A, 8B, and 8C, an ALD deposition can be performed to form top dielectric layers 132. In some embodiments, the top dielectric layers 132 can be formed along sidewalls of the channel holes 138. Thus, holes can exist in centers of the top dielectric layers 132. The formation of the top dielectric layers 132 can be followed by an directional etching using remaining portions of sidewall depositions of the top dielectric layers 132 as an etch mask. The directional etching can etch through the top dielectric layers 132, the fourth S/D regions 130, the second channel regions 127, the third S/D regions 126, the SiGe layers 144, the second S/D regions 122, the first channel regions 121, and the first S/D regions 118. Further, an isotropic etching can be applied to etch through the SiGe layers 140, which can uncover the underlying substrate 102. Accordingly, a plurality of self-aligned trenches 146 can be formed that extend from the substrate 102 and through the top dielectric layers 132, the fourth S/D regions 130, the second channel regions 127, the third S/D regions 126, the SiGe layers 144, the second S/D regions 122, the first channel regions 121, the first S/D regions 118, and the SiGe layers 140.

Figure 9A:
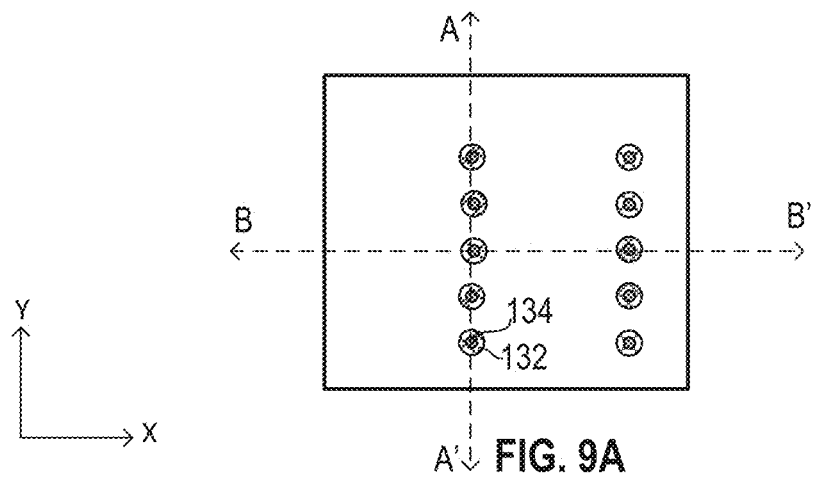
Figure 9B:
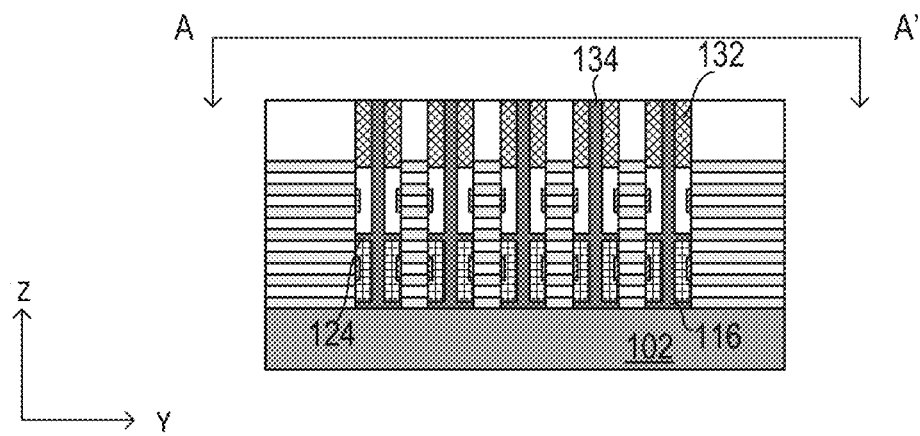
Figure 9C:
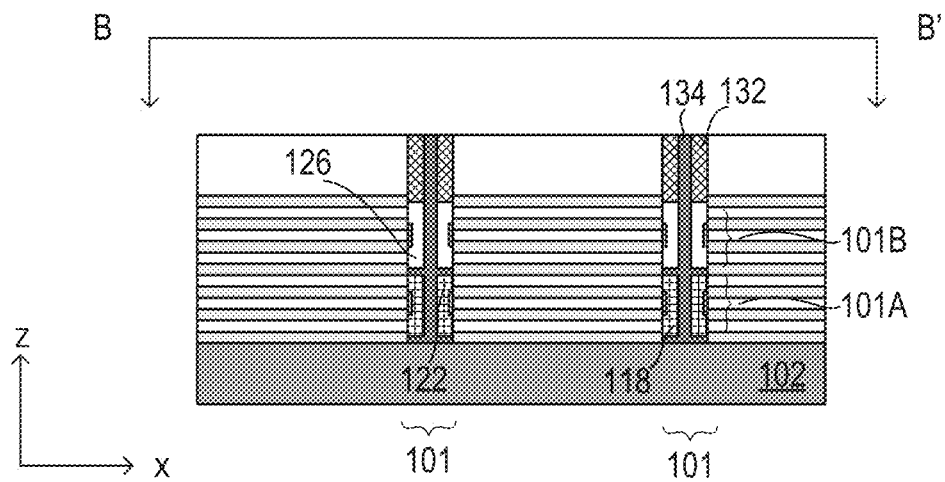

In FIGS. 9A, 9B, and 9C, the SiGe layers 140 and 142 can be removed selectively by an etching process. For example, a wet etch process can be performed by introducing an etching chemistry through the trenches 146 to remove the SiGe layers 140 and 142 selectively. After the SiGe layers 140 and 142 are removed, spaces (not shown) can be formed between the substrate 102 and the first S/D regions 118, and between the second S/D regions 122 and the third S/D regions 126. The spaces and the trenches 146 can be filled with a dielectric material. Accordingly, the bottom dielectric layers 116, the middle dielectric layers 124, and the isolation structures 134 can be formed in the spaces and the trenches 146. The filling can result in an overburden, which can be removed by CMP.

Once the bottom dielectric layers 116 the middle dielectric layers 124, and the isolation structures 134 are formed, the channel structures 101 can have identical features to the channel structures 101 in FIG. 1. For example, the channel structures 101 can include first channel sections 101A and the second channel sections 101B. The first channel sections 101A and the second channel sections 101B are spaced apart from each other by the middle dielectric layers 124. In some embodiments, the first channel sections 101A can function as p-type transistors, and the second channel sections 101B can function as n-type transistors.

Figure 10A:
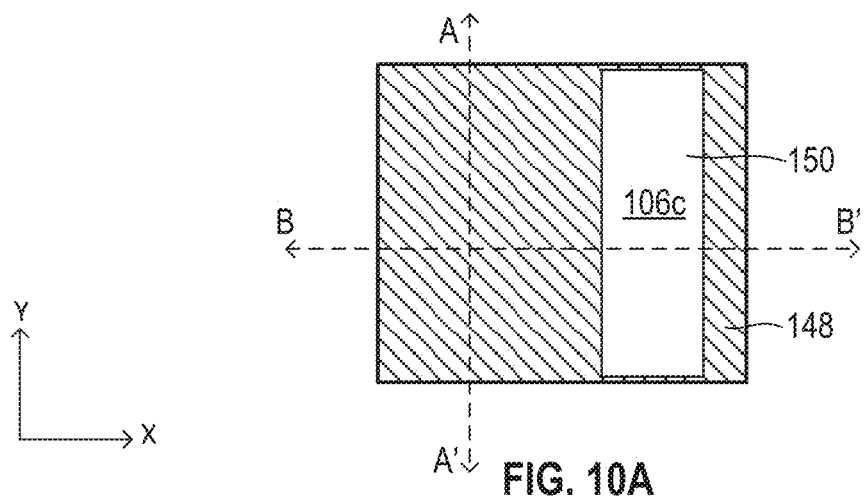
Figure 10B:
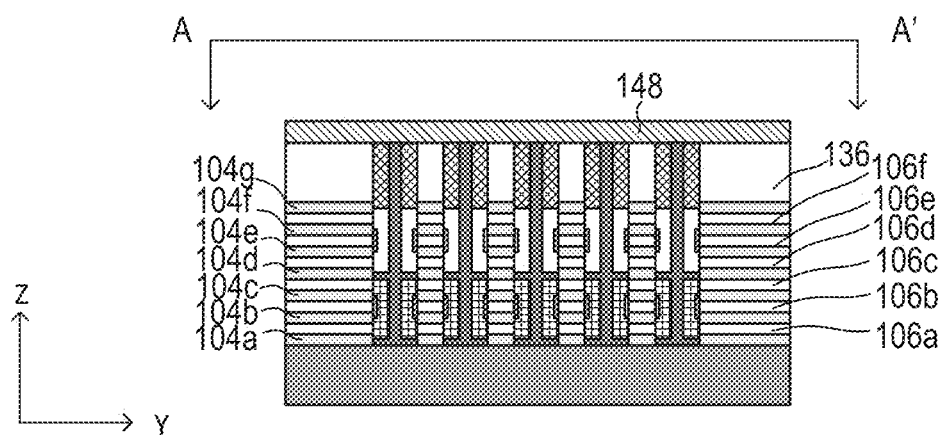
Figure 10C:
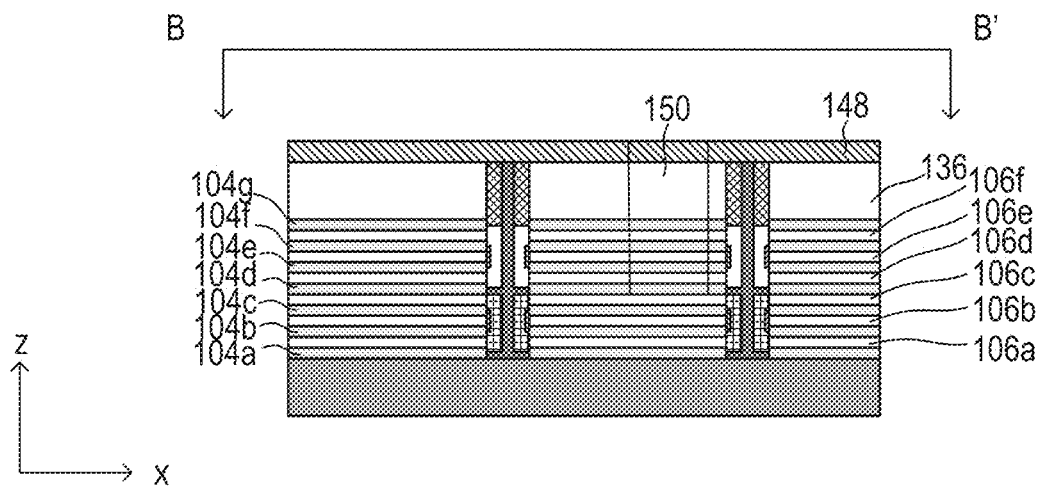

Starting from FIGS. 10A, 10B, and 10C, interconnections can be formed to connect to the channel structures 101. As shown in FIGS. 10A, 10B, and 10C, an etching mask (e.g., photoresist) 148 can be formed for building contact structures for channel structure 101. A directional etching can be executed using the etching mask 148 to form a contact opening 150. The contact opening can extend through the cap layer 136 and three pairs of insulating layers and interconnect layers. For example, the three pairs of insulating layers and interconnect layers can include the insulating layers 104d-104g, and the interconnect layers 106d-106f. When the directional etching is completed, the interconnect layer 106c can be uncovered in the contact opening 150.

Figure 11A:
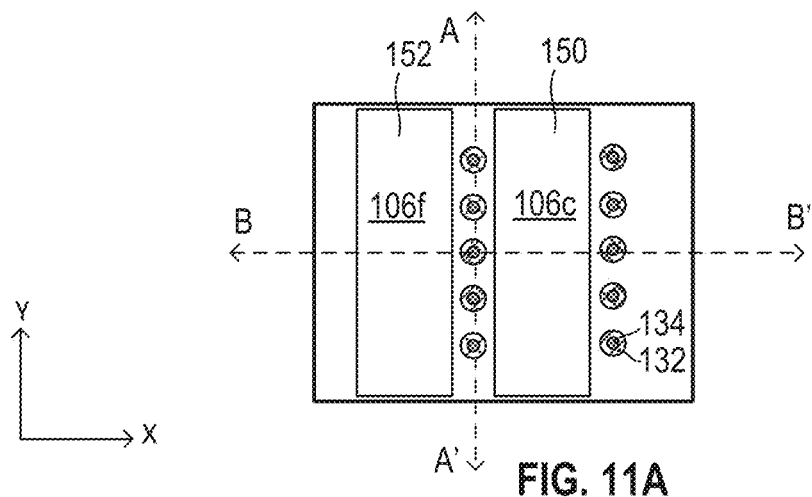
Figure 11B:
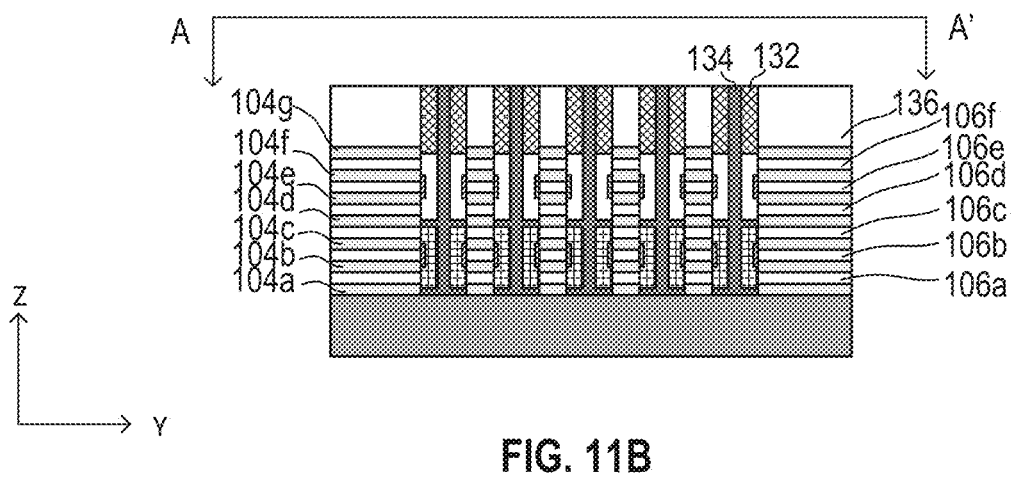
Figure 11C:
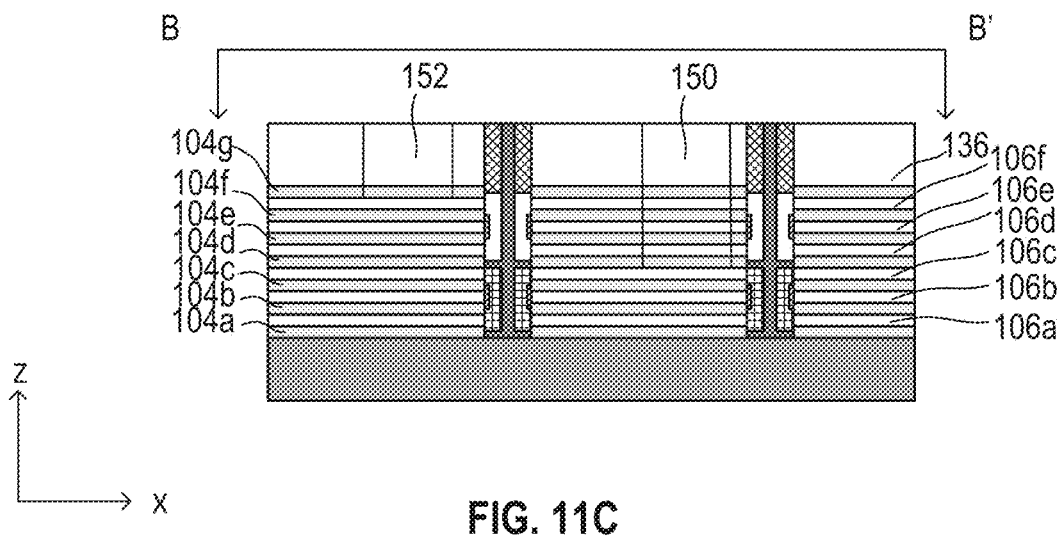

In FIGS. 11A, 11B, and 11C, a directional etching can be performed to form a contact opening 152. As shown in FIG. 11C, the contact opening 152 can extend through the insulating layer 104g and uncover on the interconnect layer 106f. In order to form the contact opening 152, a photolithography process can be applied to form a mask with patterns. The direction etching can subsequently be applied to transfer the patterns into the cap layer 136 and the insulating layer 104g to form the contact opening 152.

Figure 12A:
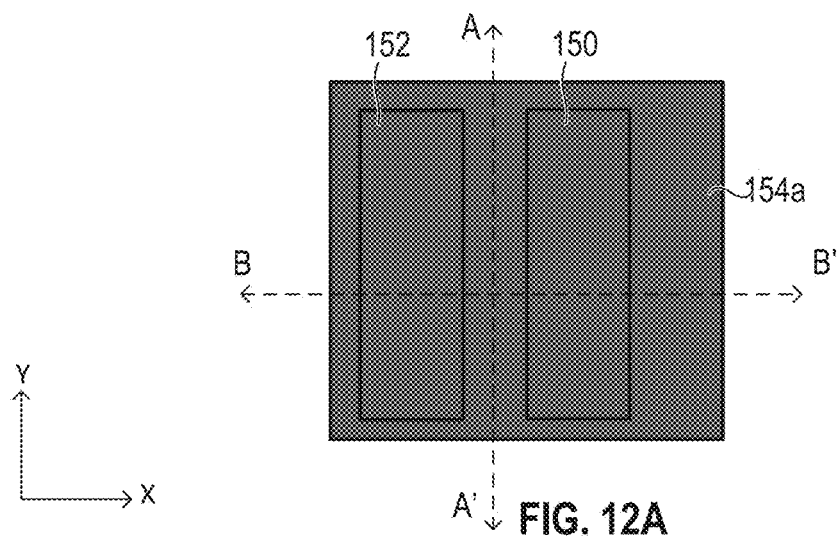
Figure 12B:
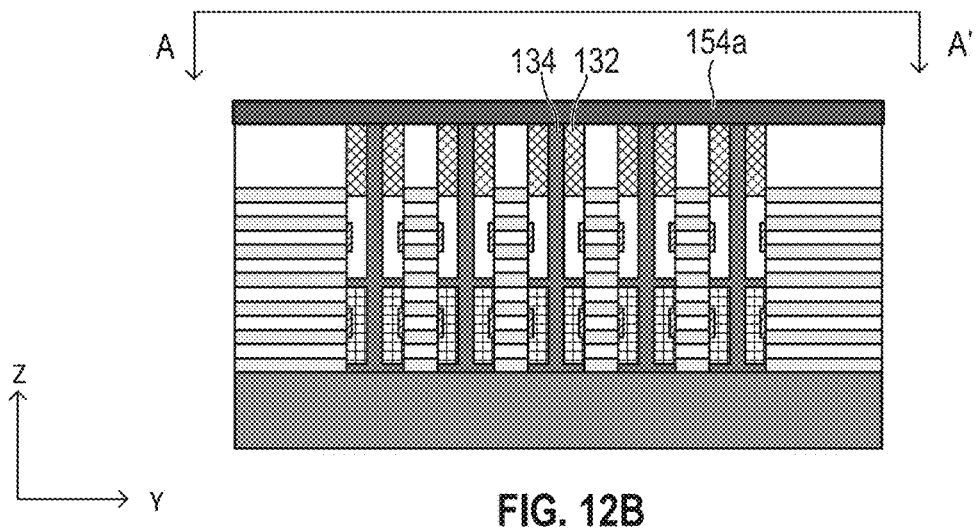
Figure 12C:
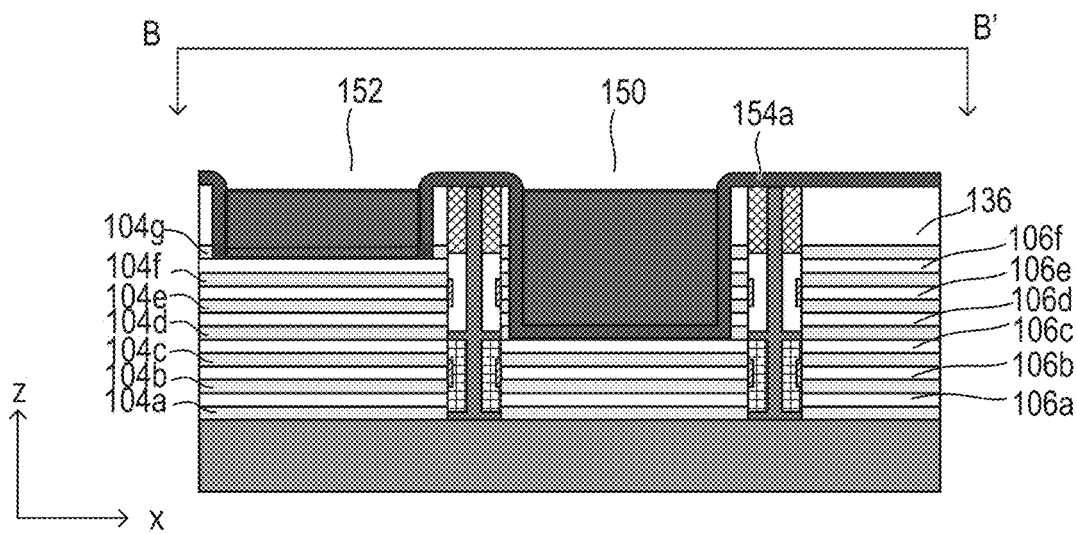

Starting from FIGS. 12A, 12B, and 12C, self-aligned double dielectric techniques can be provided. In the self-aligned double dielectric techniques, two different dielectric elements can be deposited by a deposition process (e.g., ALD) to form a plurality of bilayer dielectric structures followed by anisotropic etching to open up the interconnect layers that are in contact with the first channel section 101A and the second channel section 101B. Each of the bilayer dielectric structure can include a first dielectric layer and a second dielectric layer respectively. As shown in FIGS. 12A, 12B, and 12C, a first dielectric layer 154a can be formed. The first dielectric layer 154a can be deposited along sidewalls of the contact openings 150 and 152, and further over bottoms of the contact openings 150 and 152. Accordingly, the first dielectric layer 154a can be positioned over the interconnect layer 106f in the contact opening 150 and over the interconnect layer 106c in the contact opening 152. It should be noted that the first dielectric layer 154a can also be positioned over the top dielectric layer 132 and the cap layer 136.

Figure 13A:
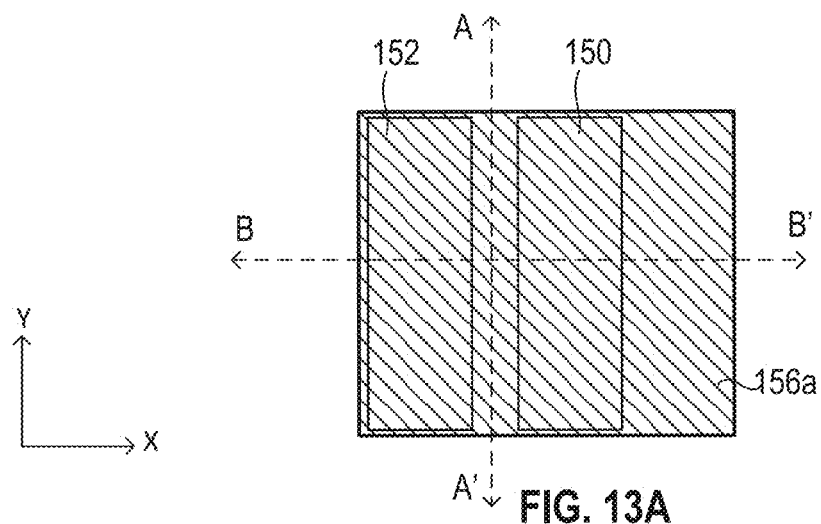
Figure 13B:
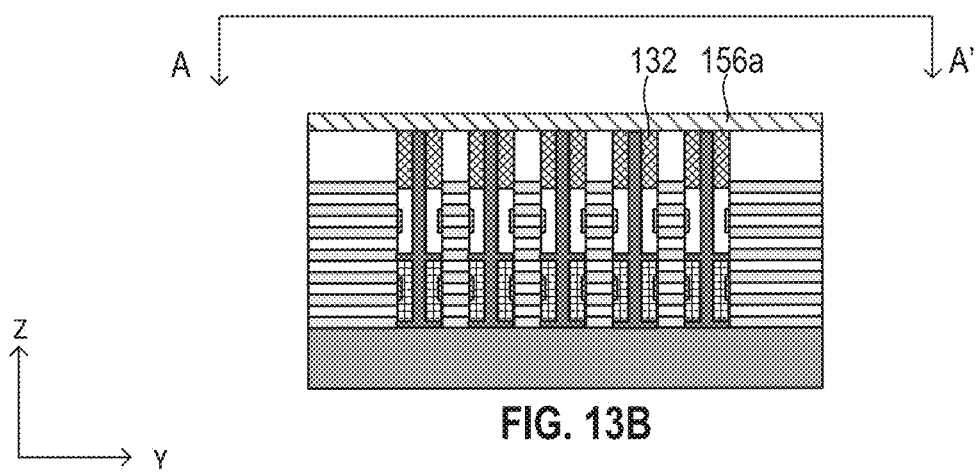
Figure 13C:
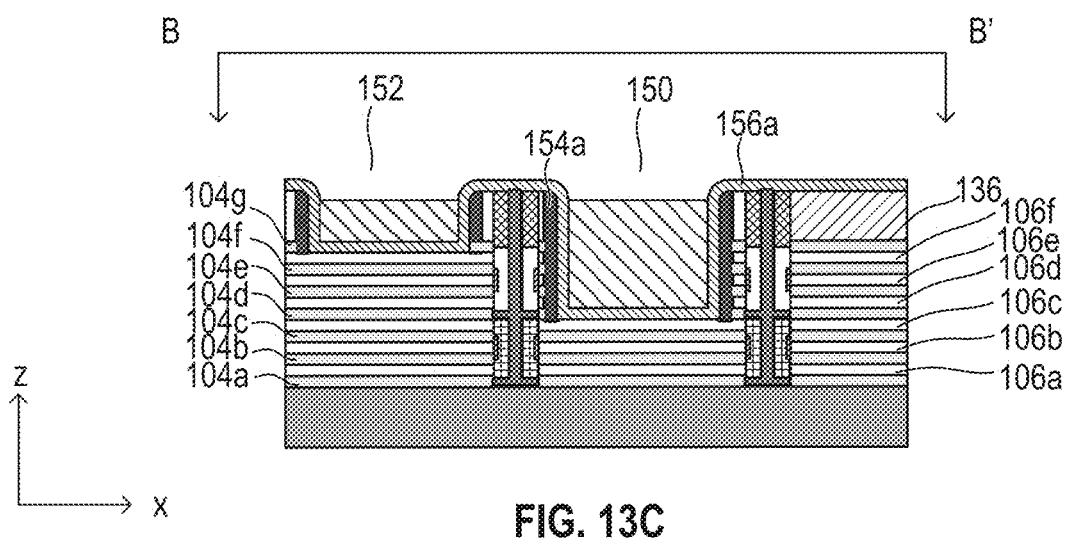

In FIGS. 13A, 13B, and 13C, an anisotropic etching can be performed to remove the bottom portions of the first dielectric layer 154a that are positioned over the interconnect layer 106f and the interconnect layer 106c. Thus, the interconnect layer 106f and the interconnect layer 106c can be uncovered in the contact openings 150 and 152. Subsequently, a second dielectric layer 156a can be formed in the contact openings 150 and 152 and positioned over the interconnect layer 106f and the interconnect layer 106c. The second dielectric layer 156a can also be deposited over the cap layer 136 and the top dielectric layer 132.

Figure 14A:
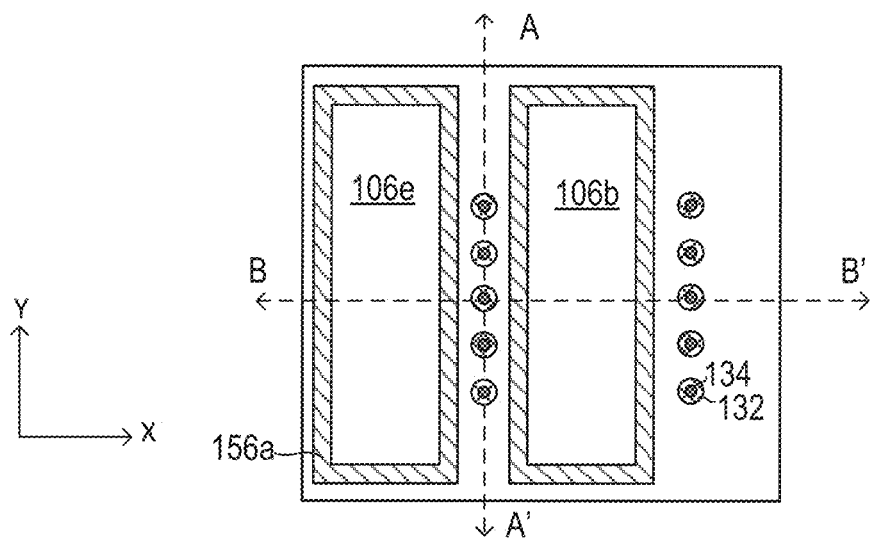
Figure 14B:
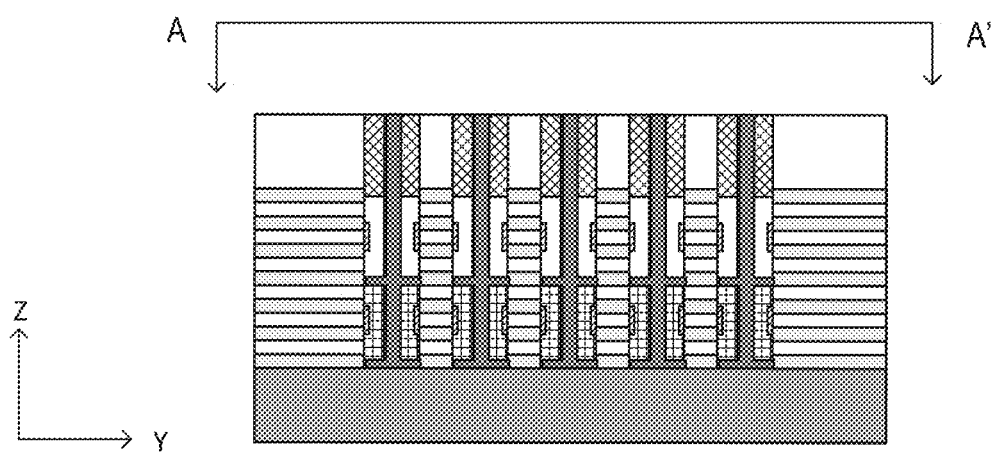
Figure 14C:
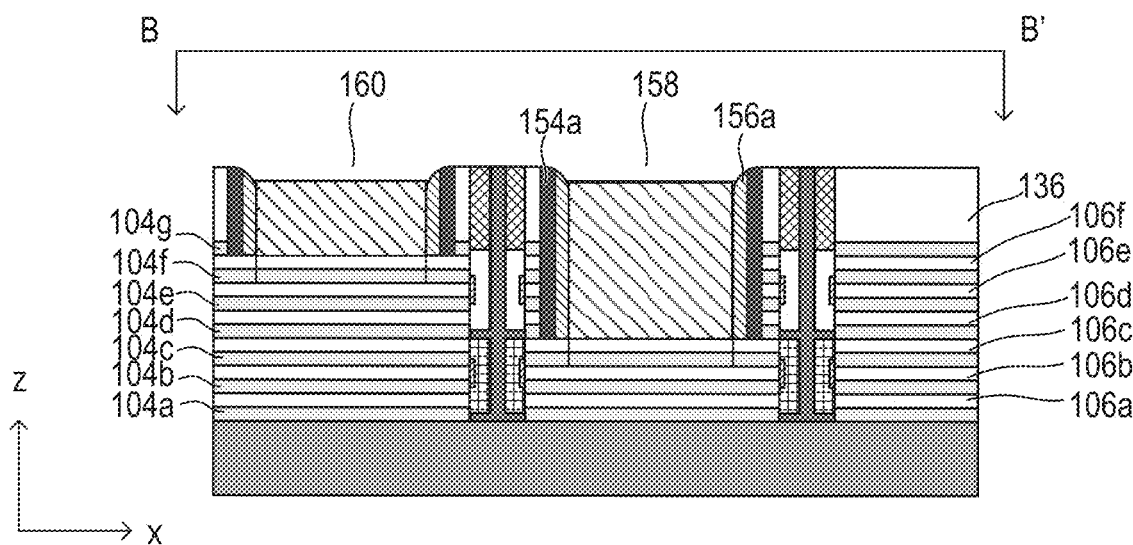

In FIGS. 14A, 14B, and 14C, a directional etching can be performed to remove the bottom portion of the second dielectric layer 156a that is positioned over the interconnect layer 106f in the contact opening 152, and further remove portions of the interconnect layer 106f and the insulating layer 104f that are positioned under the bottom portion of the second dielectric layer 156a. Accordingly, a contact opening 160 can be formed to uncover the interconnect layer 106e. Similarly, the directional etching can be performed to remove the bottom portion of the second dielectric layer 156a that is positioned over the interconnect layer 106c in the contact opening 150, and further remove portions of the interconnect layer 106c and the insulating layer 104c that are positioned under the bottom portion of the second dielectric layer 156a. Accordingly, a contact opening 158 can be formed to uncover the interconnect layer 106b. As shown in FIG. 14C, a first bilayer dielectric structure and second bilayer dielectric structure can be accordingly formed. The first bilayer dielectric structure can include the first dielectric layer 154a and the second dielectric layer 156a that are formed along sidewalls of the contact opening 160, and positioned over the interconnect layer 106f. The second bilayer dielectric structure can include the first dielectric layer 154a and the second dielectric layer 156a that are formed along sidewalls of the contact opening 158 and positioned over the interconnect layer 106c.

Figure 15A:
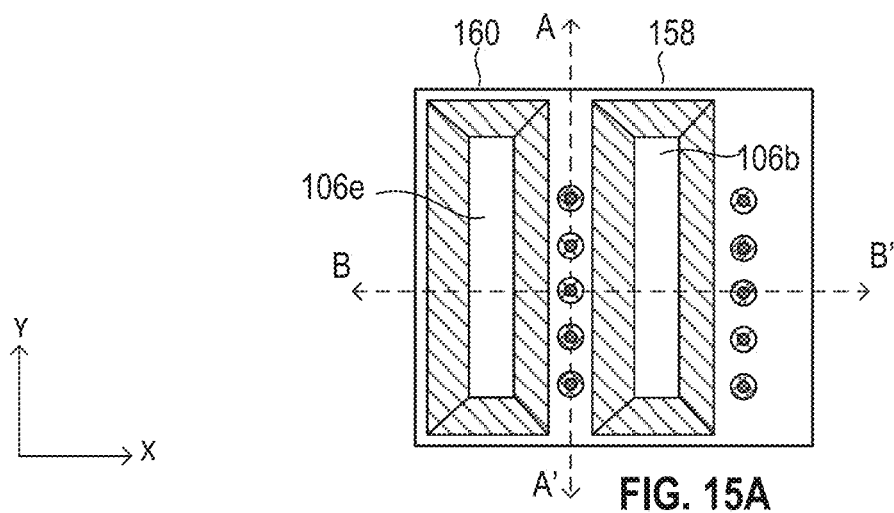
Figure 15B:
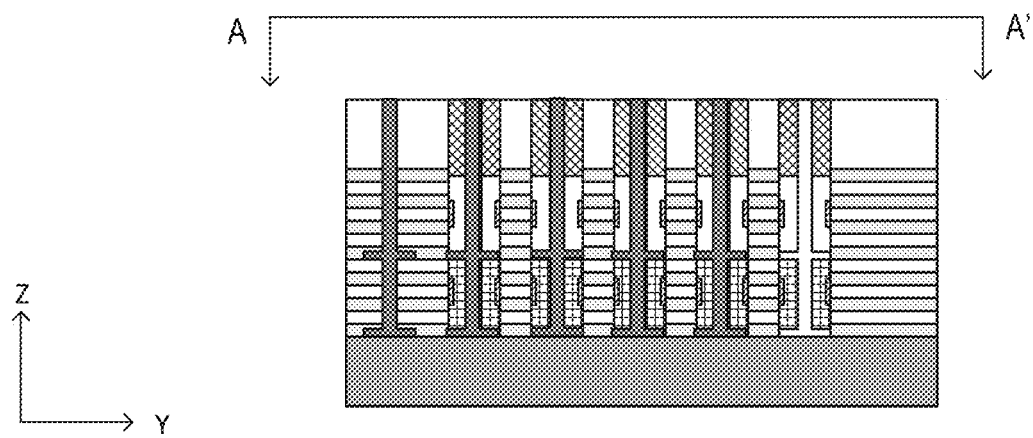
Figure 15C:
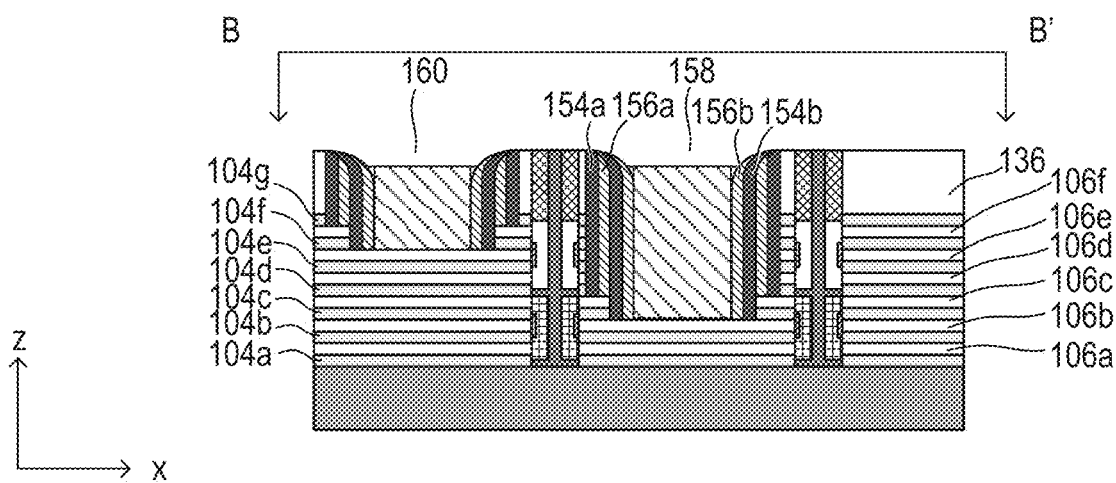

In FIGS. 15A, 15B, and 15C, a second set of ALD deposition of a first dielectric layer 154b and a second dielectric layer 156b can be executed. As shown in FIG. 15C, the first dielectric layer 154b and the second dielectric layer 156b can be formed along the sidewalls of the contact openings 158 and 160, and further over the interconnect layer 106e in contact opening 160 and the interconnect layer 106b in contact opening 158. A directional etching can be followed to remove the portions of the first dielectric layer 154b and the second dielectric layer 156b that are positioned over the interconnect layer 106e and the interconnect layer 106b. Accordingly, the interconnect layer 106e and the interconnect layer 106b can be uncovered. The first dielectric layer 154b and the second dielectric layer 156b can form bilayer dielectric structures that are positioned along the sidewalls of the contact openings 158 and 160, and disposed over the interconnect layer 106e and the interconnect layer 106b.

Figure 16A:
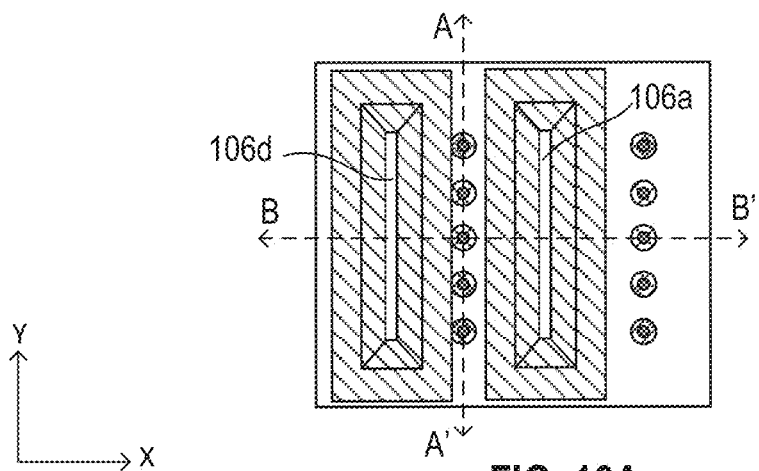
Figure 16B:
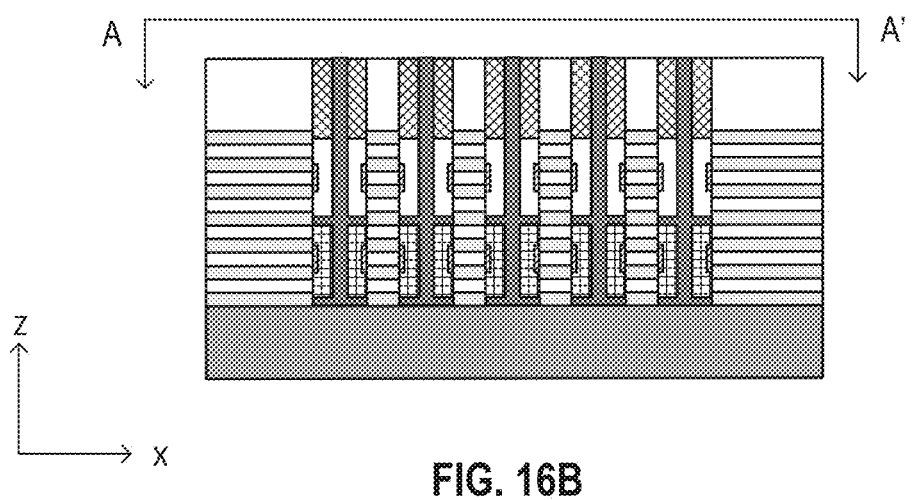
Figure 16C:
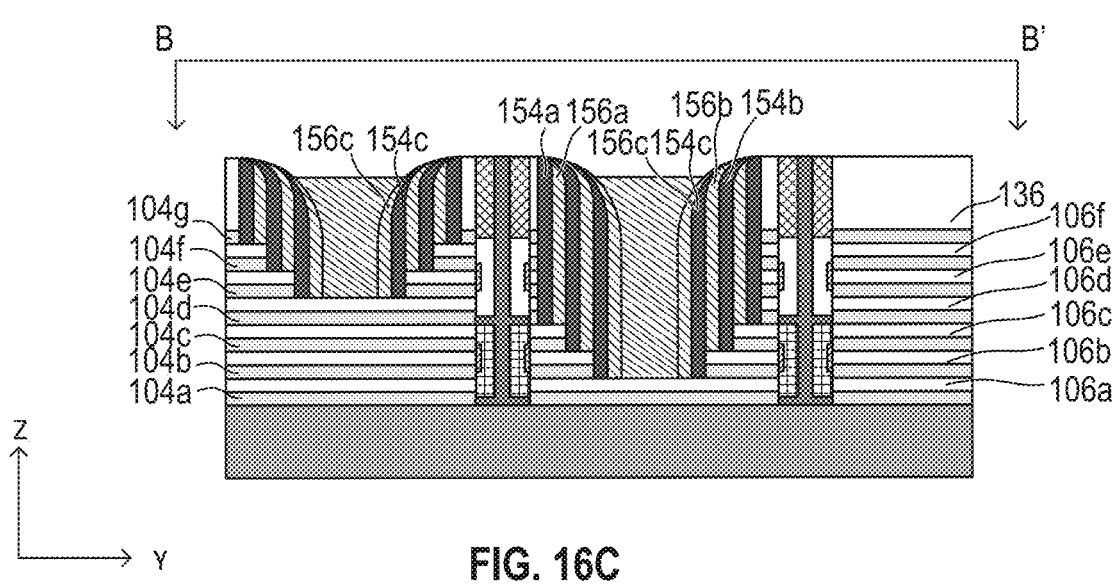

In FIGS. 16A, 16B, and 16C, a same process sequence as the process sequence provided in FIGS. 15A, 15B, and 15C can be applied to form bilayer dielectric structures that include first dielectric layers 154c and second dielectric layers 156c. The bilayer dielectric structures can be disposed over the interconnect layers 106d and 106a.

Figure 17A:
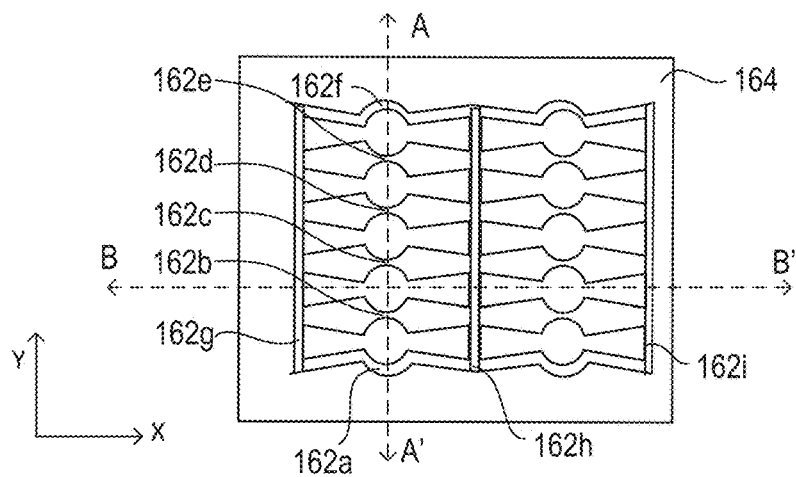
Figure 17B:
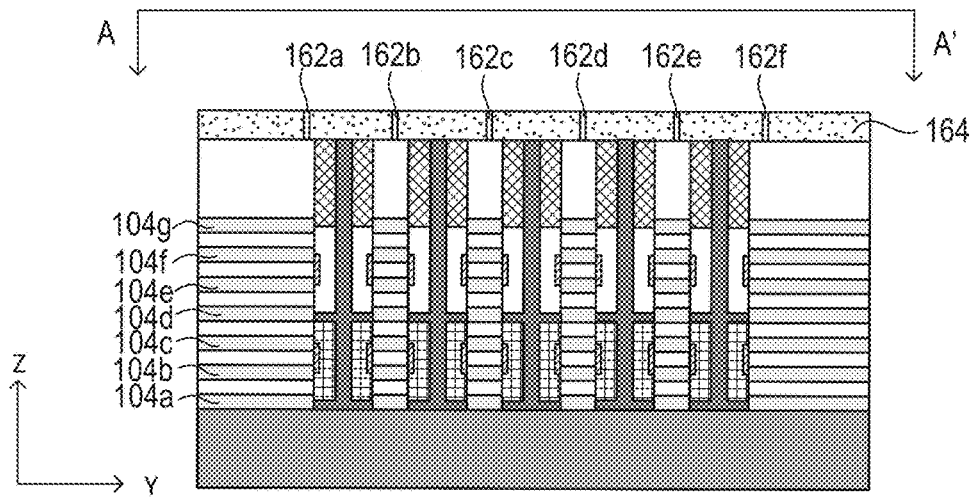
Figure 17C:
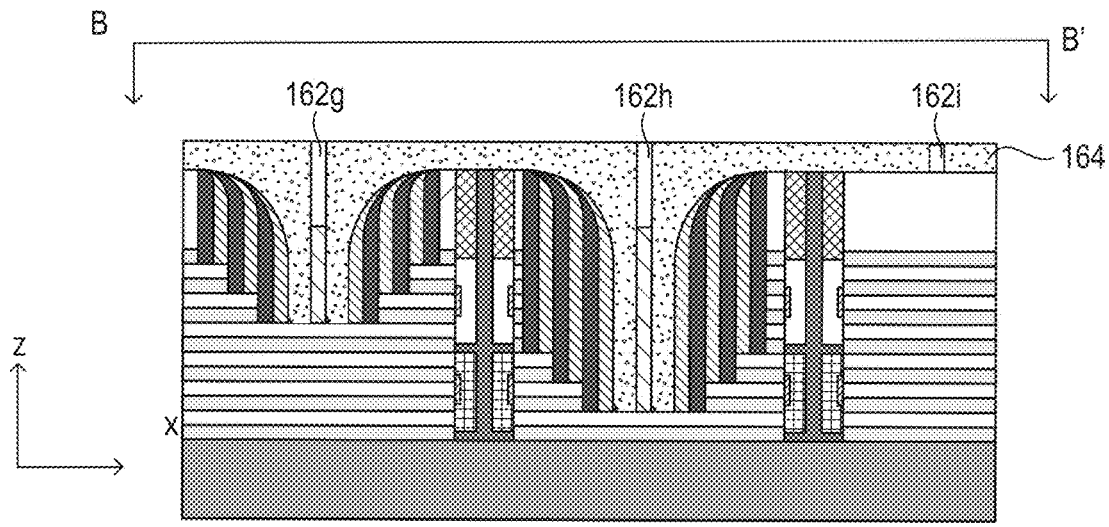

In FIGS. 17A, 17B, and 17C, an etch mask 164 can be formed for create device separation patterns (e.g., 162a-162f and 162i) and contact area openings (e.g., 162g-162h) for both the first channel section 101A and the second channel section 101B. In order to form the etch mask 164, a lithography process can be applied. The lithography process may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combination thereof.

Figure 18A:
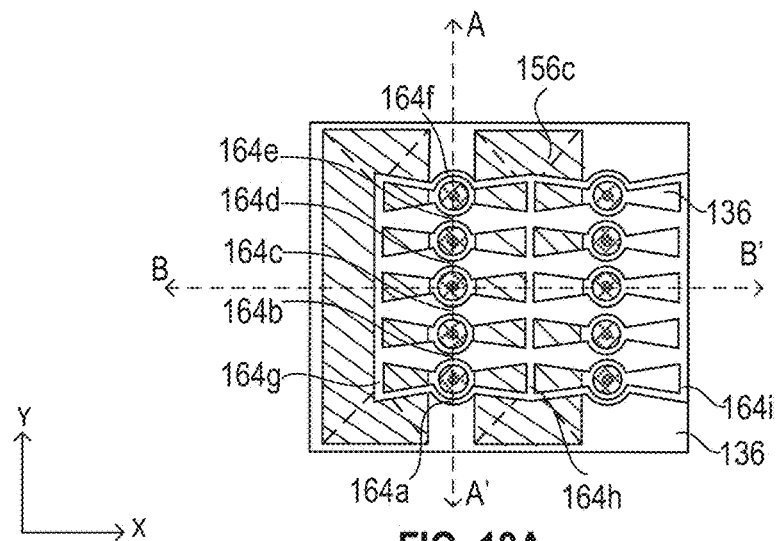
Figure 18B:
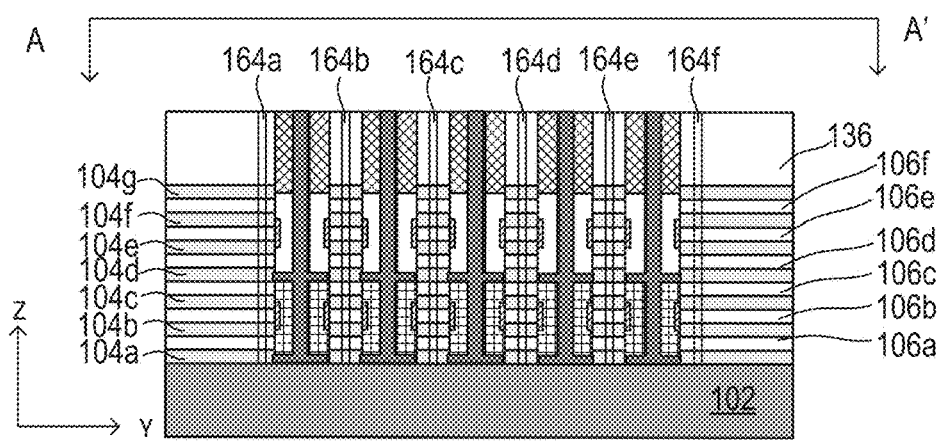
Figure 18C:
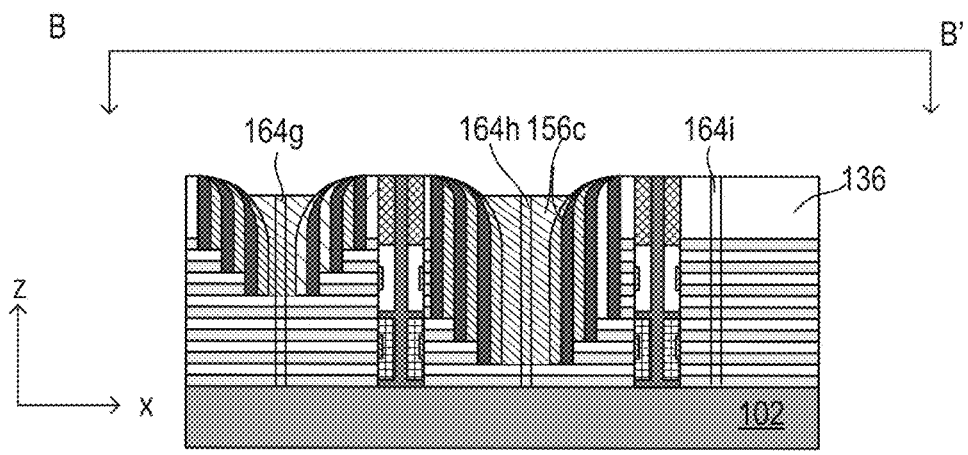

In FIGS. 18A, 18B, and 18C, a direction etching can be performed to transfer the device separation patterns (e.g., 162*a*-162*f* and 162*i*) and contact area openings (e.g., 162*g*-162*h*) into the cap layer 136, the insulating layers 104*a*-104*g*, and the interconnect layers 106*a*-106*f*. Accordingly, device separation openings (e.g., 164*a*-164*f* and 164*i*) and the contact openings (e.g., 164*g* and 164*h*) can be formed. The device separation openings (e.g., 164*a*-164*f* and 164*i*) and the contact openings (e.g., 164*g* and 164*h*) can extend from the substrate 102 and through the cap layer 136, the insulating layers 104*a*-104*g*, and the interconnect layers 106*a*-106*f*.

Figure 19A:
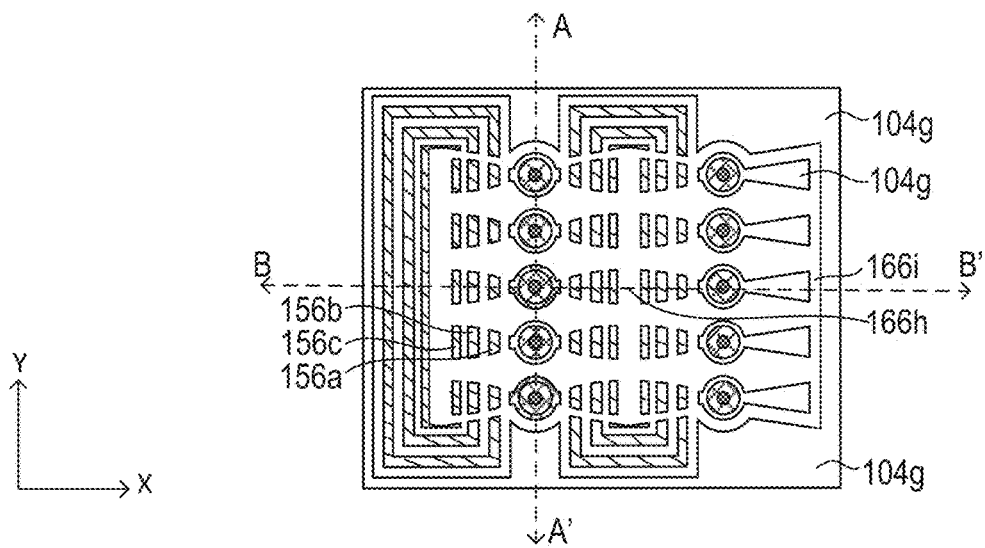
Figure 19B:
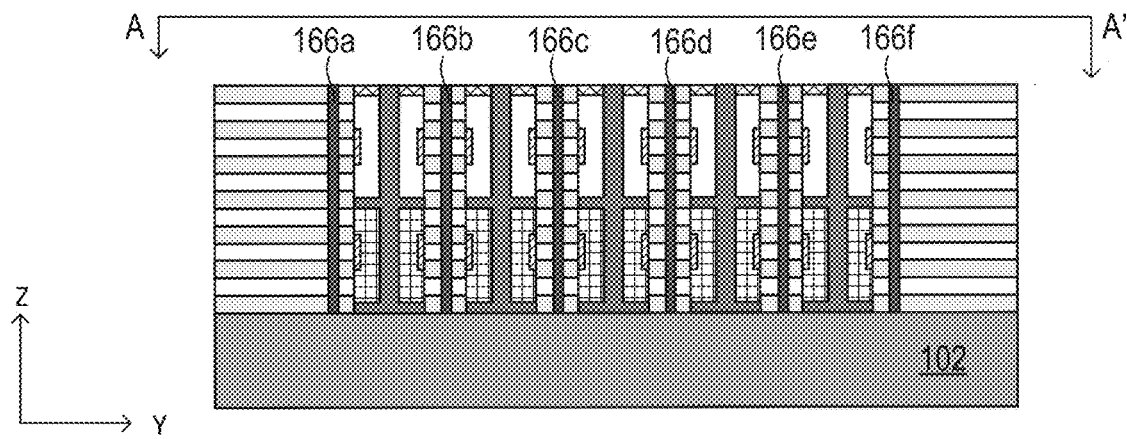
Figure 19C:
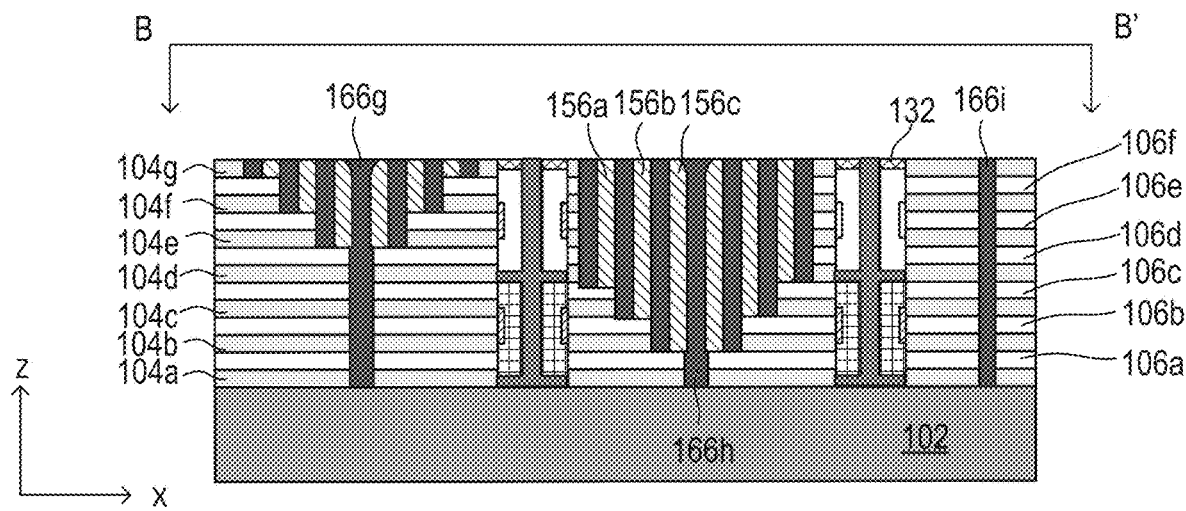

In FIGS. 19A, 19B, and 19C, masking materials can be removed followed by filling the device separation openings (e.g., 164*a*-164*f* and 164*i*) and contact openings (e.g., 164*g*-164*h*) with a dielectric material. In some embodiments, the dielectric material can be the same dielectric material that is applied to form the first dielectric layer (e.g., 154*a*, 154*b*, and 154*c*). Accordingly, device separation structures (e.g., 164*a*-164*f* and 164*i*) and dummy contacts (e.g., 164*g*-164*h*) can be formed. Further, a surface planarization, such as a chemical-mechanical polishing (CMP), can be applied to remove the cap layer 136. The surface planarization can stop on the insulating layer 104*g*. It should be noted that portions of the top dielectric layers 132 can also be removed by the surface planarization.

Figure 20A:
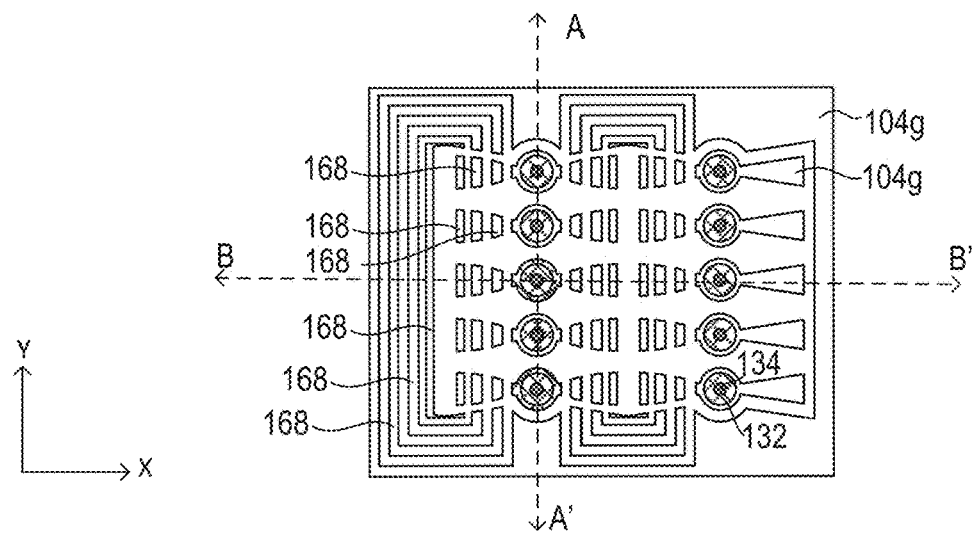
Figure 20B:
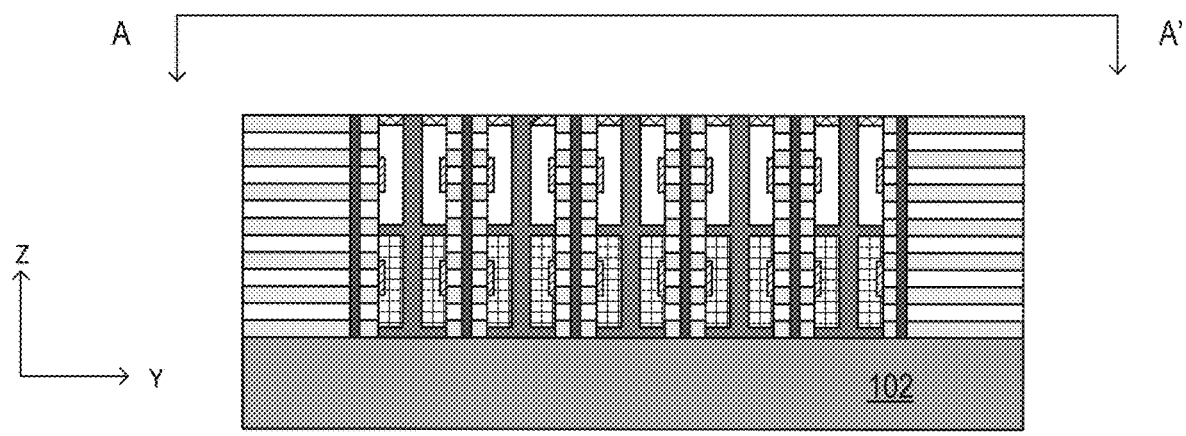
Figure 20C:
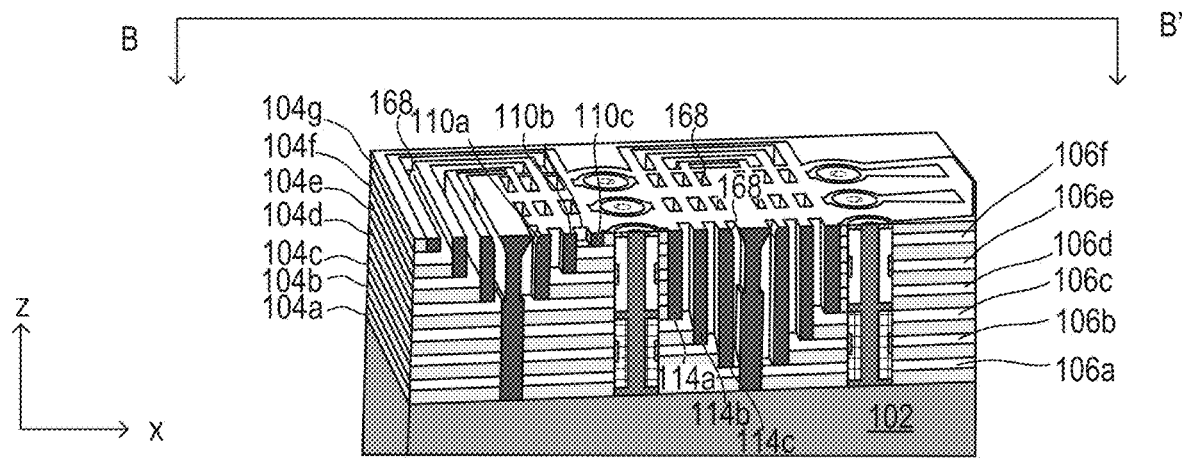

In FIGS. 20A, 20B, and 20C, the second dielectric layers (e.g., 156*a*-156*c*) can be removed by a selective etching. Accordingly, a plurality of self-aligned metal contact openings 168 can be formed. The metal contact openings 168 can uncover the interconnect layers 106*a*-106*f*. It should be noted that when the second dielectric layers are removed, the first dielectric layers can become spacers (e.g., 110*a*-110*c* and 114*c*-114*c*) which can function as isolation layers between metal contacts that are formed in the metal contact openings 168 in subsequent steps.

Figure 21A:
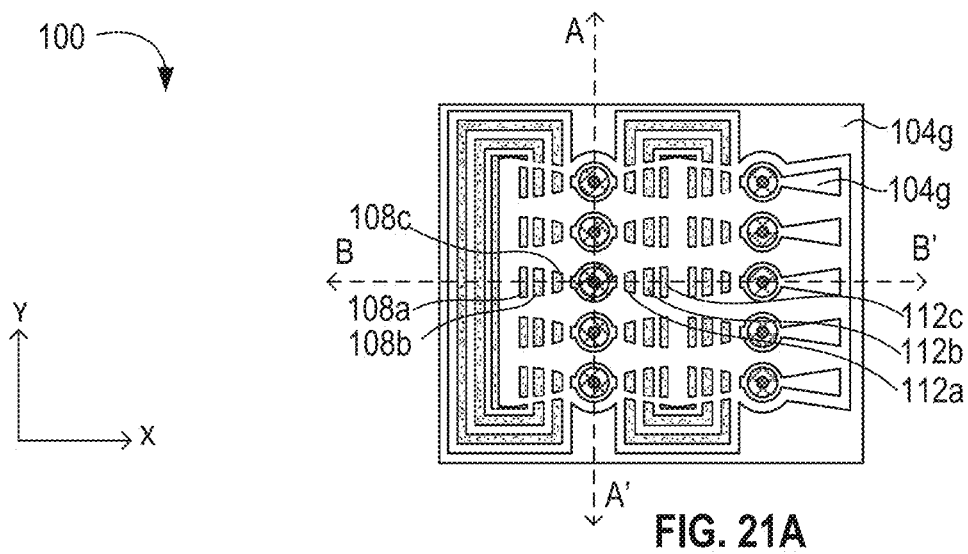
Figure 21B:
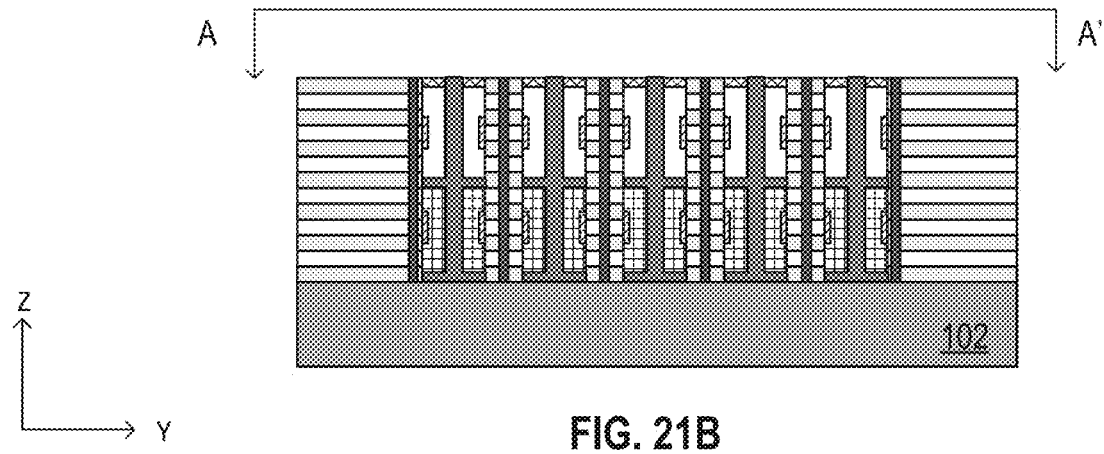
Figure 21C:
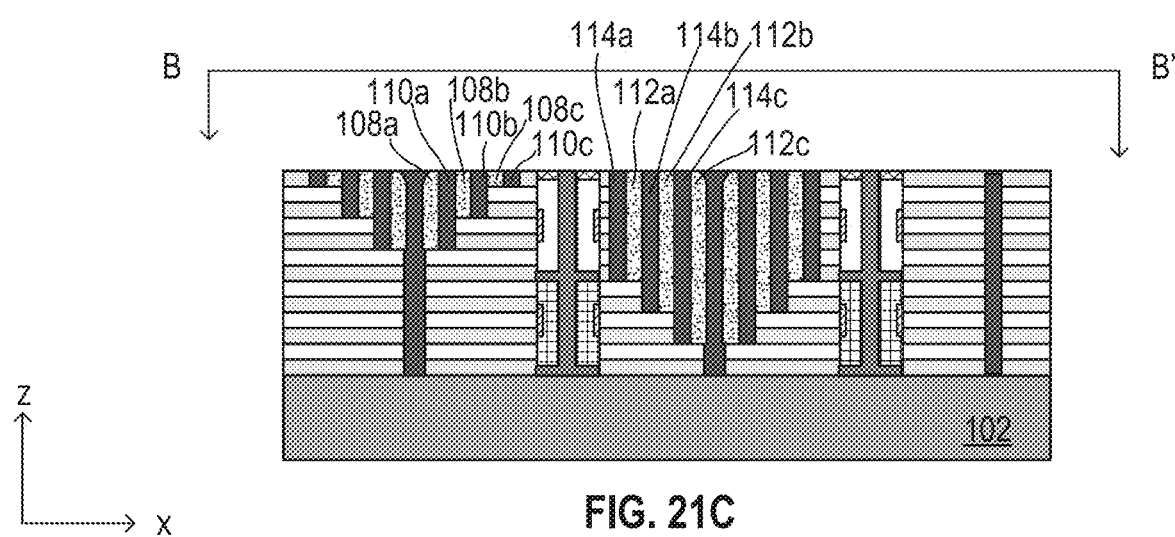

In FIGS. 21A, 21B, and 21C, the metal contact openings 168 can be filled with a conductive material, such as W, Co, Ru, or the like. Further, overburden of the conductive material deposition can be removed by a CMP process. Accordingly, the conductive material remaining in the metal contact openings 168 can become the contact structures. For example, the contact structures 108*a*-108*c* and the 112*a*-112*c* can be formed in the metal contact openings 168. The contact structures can extend from and coupled to the interconnect layers in a staircase configuration such that each of the plurality of contact structures extends from a respective interconnect layer. When the formation of the contact structures are completed, a semiconductor device 100 can be formed accordingly. The semiconductor device 100 can have similar features to the device 100 in FIG. 1.

Figure 22:
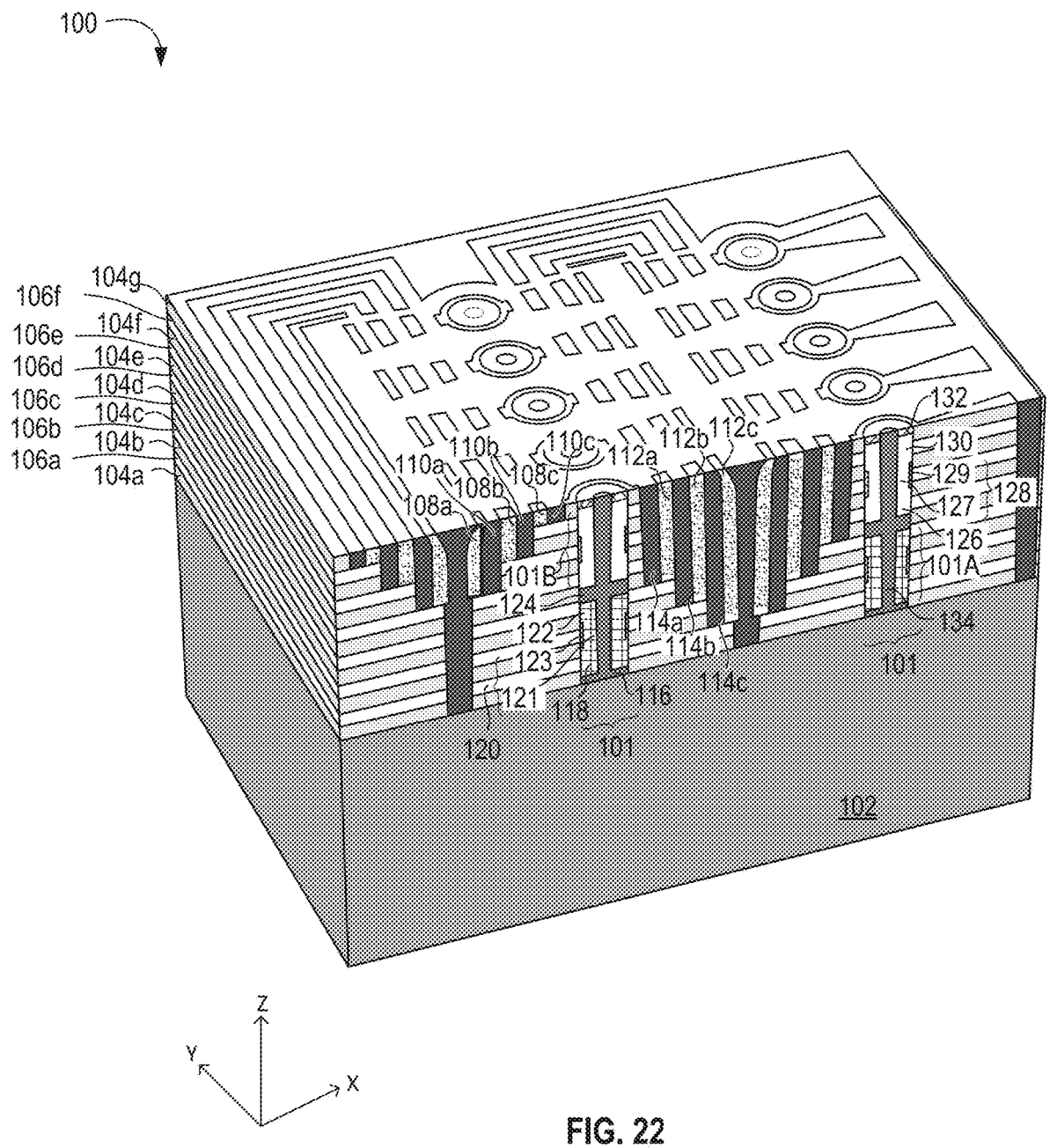

FIG. 22 shows a perspective view of the semiconductor device 100 that is formed based on the device fabrication process starting with FIGS. 2A and 2B. The semiconductor device shown in FIG. 22 can have similar features to the device shown in FIG. 1. In the device fabrication process discussed above, the self-aligned dielectric materials (e.g., the first dielectric layers 154*a*-154*c* and the second dielectric layers 156*a*-156*c*), layers (e.g., the interconnect layers 106*a*-106*f*) and structures (e.g., device separation structures 164*a*-164*f* and 164*i*) can enable opening spaces (e.g., metal contact openings 168) for different metal contacts for Drain (e.g., first S/D region 118), Gate (e.g., first gate region 120) and Source (e.g., second S/D region 122) without any lithography. In the disclosure, a compact design of the circuitry can be obtained by combining the vertical channel structures with the self-aligned contact structures. In addition, a circular ring and polygon reticle around the device can be applied to form separation structures that can separate the device from remaining or adjacent devices.

Figure 23:
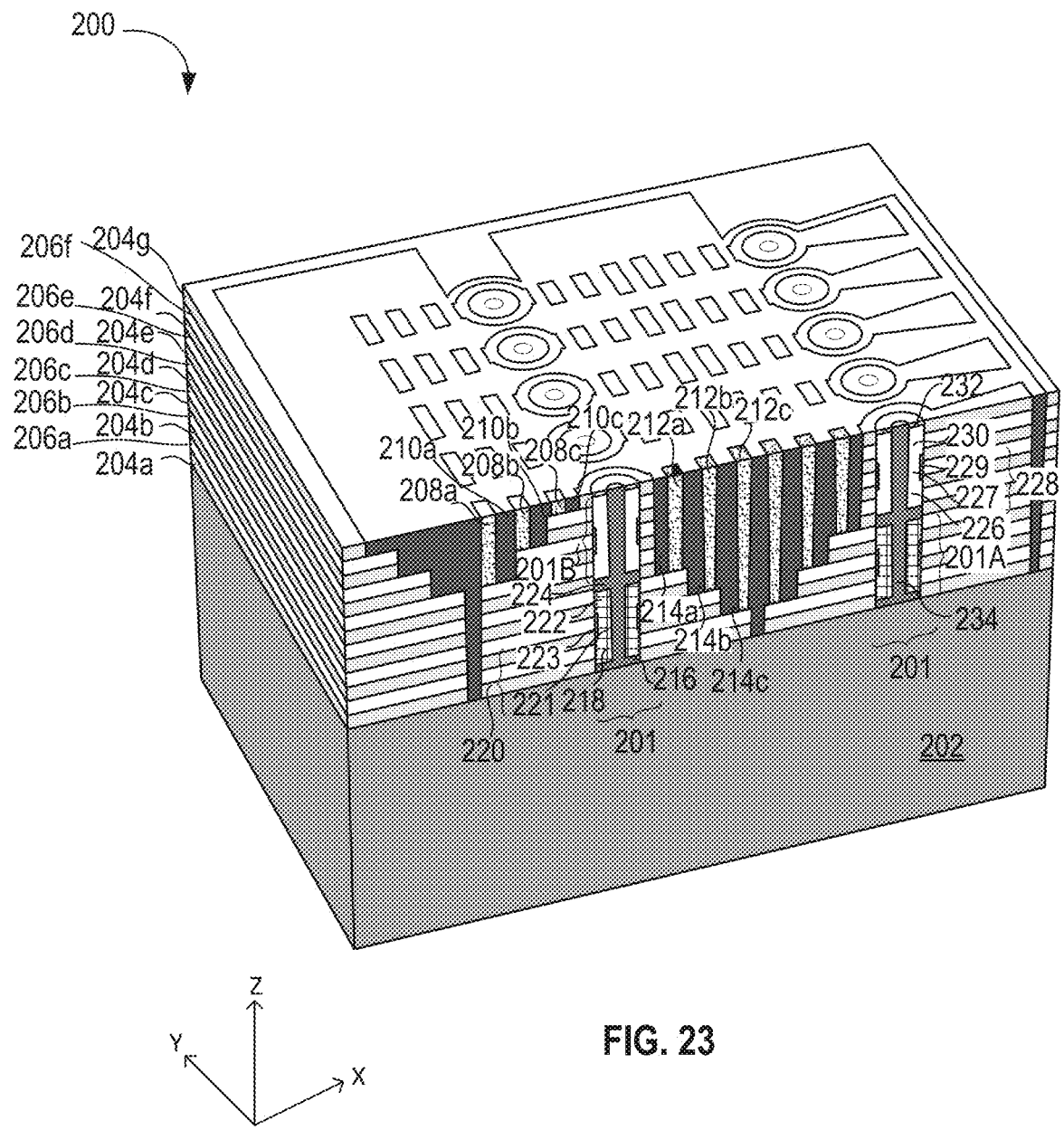
FIG. 23 is a perspective view of a second semiconductor device, in accordance with some embodiments.

FIG. 23 illustrates a semiconductor device (or device) 200 that includes interconnections using a self-aligned dielectric technique. FIGS. 24-32 illustrate intermediate steps of forming the interconnections based on the self-aligned dielectric technique, which can include a single dielectric element deposited by a deposition process (e.g., ALD) followed by anisotropic etching to open up the metal contacts (e.g., the interconnect layers) of channel sections (e.g., the first channel section 201A or the second channel section 201B in FIG. 23).

As shown in FIG. 23, the device 200 can have similar features to the device 100 in FIG. 1. For example, the device 100 can include a stack of alternating insulating layers (e.g., 204*a*-204*g*) and interconnect layers (e.g., 206*a*-206*f*) that are formed over a substrate 202. A plurality of channel structures 201 can extend from the substrate 202 and further through the insulating layers 204 and the interconnect layers 206. Each of the channel structures 201 can include a first channel section 201A positioned over the substrate 202 and coupled to a first group of the interconnect layers (e.g., 206*a*-206*c*), and a second channel section 201B positioned over the first channel section 201A and coupled to a second group of the interconnect layers (e.g., 206*d*-206*f*). The device 200 can also include a plurality of contact structures (e.g., 208*a*-208*c* and 212*a*-212*c*) extending from and coupled to the interconnect layers 206 in a staircase configuration such that each of the plurality of contact structures extends from a respective interconnect layer. The device 200 can include a plurality of spacers (e.g., 210*a*-202*c* and 214*a*-214*c*) that extend from the interconnect layers 206 and are positioned between the plurality of contact structures such that the plurality of spacers and the plurality of contact structures are disposed alternatingly along a direction (e.g., X direction) parallel to the substrate 102.

The first channel section 201A can further include a first S/D region 218 formed over the substrate, and a first gate region 220 formed over the first S/D region 218. The first gate region 220 can include a first channel region 221 over the first S/D region 218 and a first gate oxide 223 around the first channel region. The first channel section 201A can also include a second S/D region 222 over the first gate region 220.

The second channel section 201B can include a third S/D region 226 formed over the second S/D region 222 of the first channel section 201A, and a second gate region 228 formed over the third S/D region 226. The second gate region 228 can include a second channel region 227 over the third S/D region 226 and a second gate oxide 229 around the second channel region 227. The second channel section 201B can also include a fourth S/D region 230 over the second gate region 228.

Still referring to FIG. 23, the channel structure 201 can further include a bottom dielectric layer 216 positioned between the substrate 202 and the first S/D region 218 of the first channel section 201A, a middle dielectric layer 224 positioned between the second S/D region 222 of the first channel section 201A and the third S/D region 226 of the second channel section 201B, and a top dielectric layer 232 positioned over the fourth S/D region 230 of the second channel section 201B. The channel structure can include an isolation structure 234 extending from the bottom dielectric layer 216 and further through the first channel section 201A, the middle dielectric layer 224, the second channel section 201B, and the top dielectric layer 232.

Figure 24A:
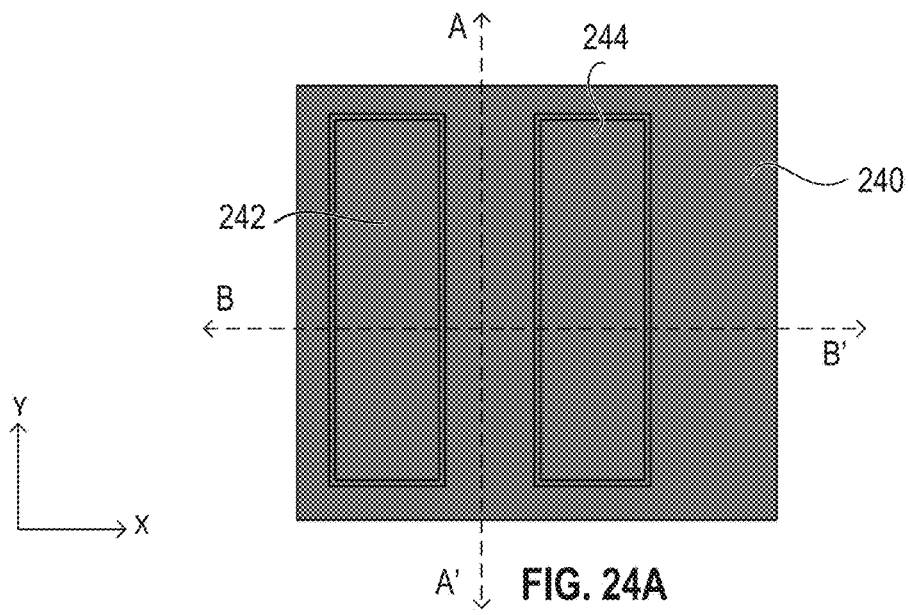
FIGS. 24A, 24B, 24C, 25A, 25B, 25C, 26A, 26B, 26C, 27A, 27B, 27C, 28A, 28B, 28C, 29A, 29B, 29C, 30A, 30B, 30C, 31A, 31B, 31C, and 32 are top-down views, cross-sectional views, and perspective views of various intermediate steps in a manufacturing flow to fabricate the second semiconductor device, in accordance with some embodiments.
Figure 24B:
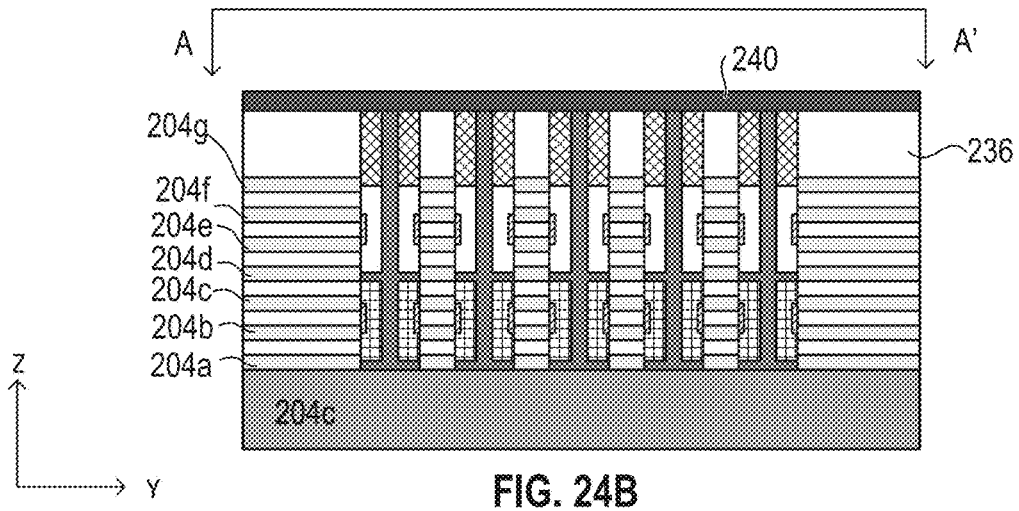
Figure 24C:
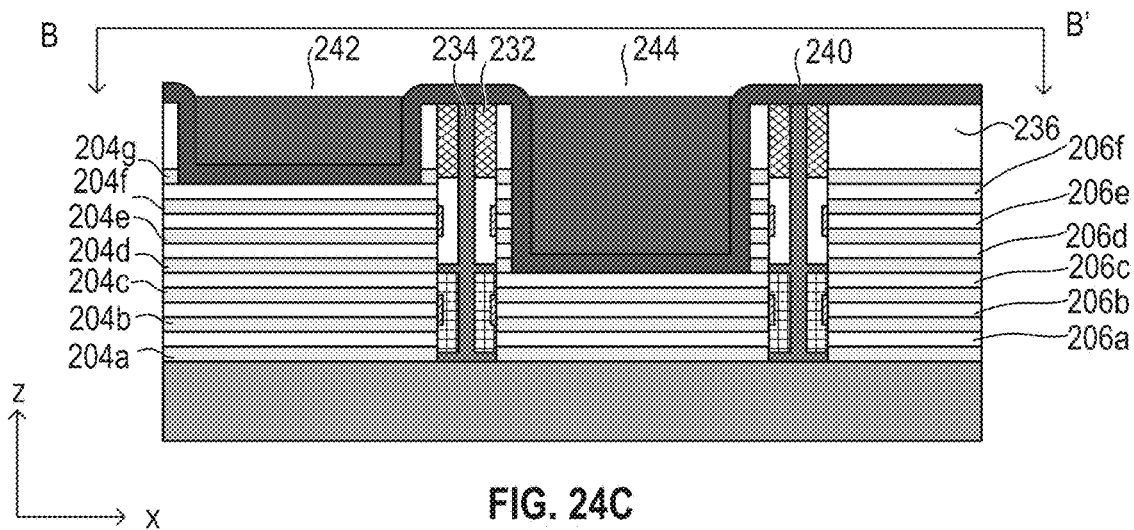

As mentioned above, FIGS. 24-32 illustrate intermediate steps of forming the device 200 based on the self-aligned dielectric technique. As shown in FIGS. 24A, 24B, and 24C, a first dielectric structure 240 can be formed in contact openings 242 and 244. The first dielectric structure 240 can have side portions formed along sidewalls of the contact openings 242 and 244, bottom portions over the interconnect layer 206f in the contact opening 242 and the interconnect layer 206c in the contact opening 244. The first dielectric structure 240 can also have a top portion over a cap layer 236 and the top dielectric layer 232.

Figure 25A:
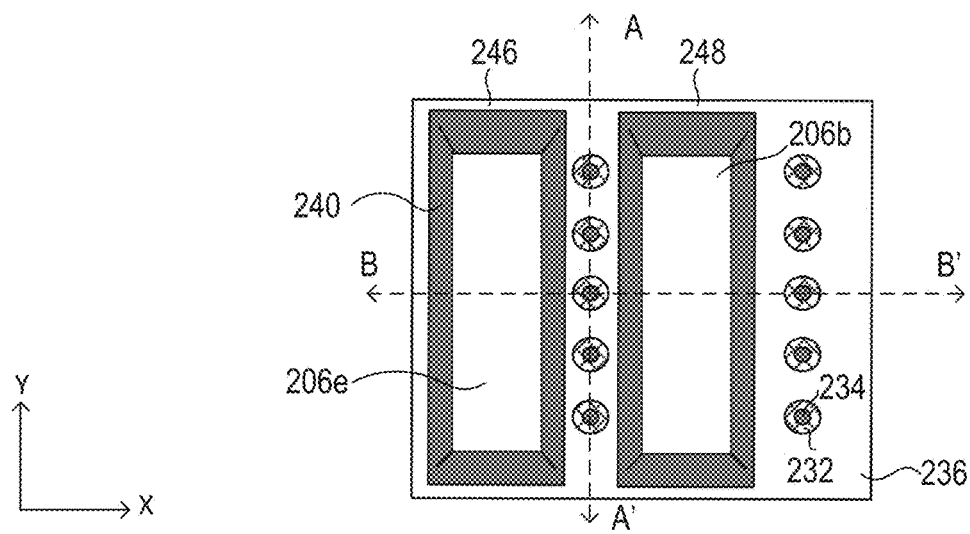
Figure 25B:
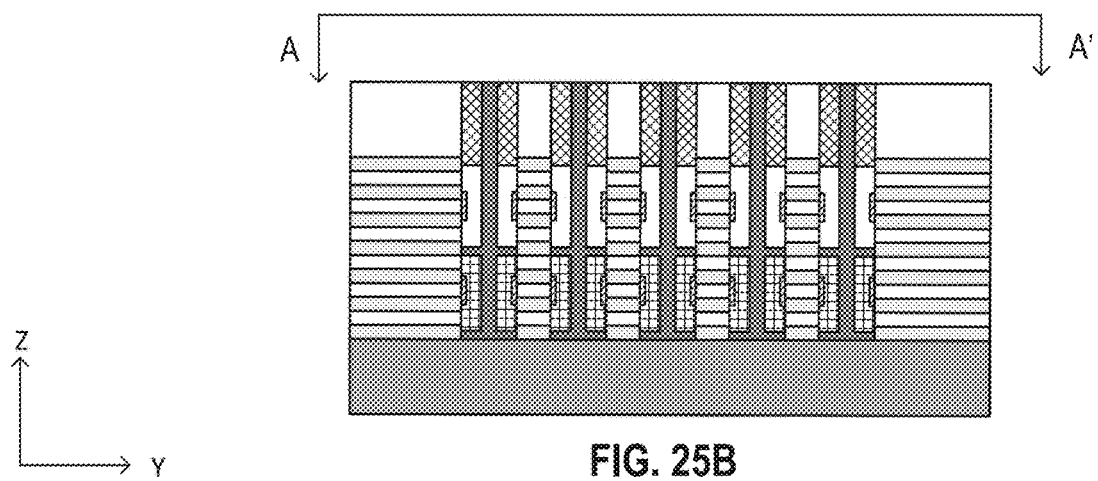
Figure 25C:
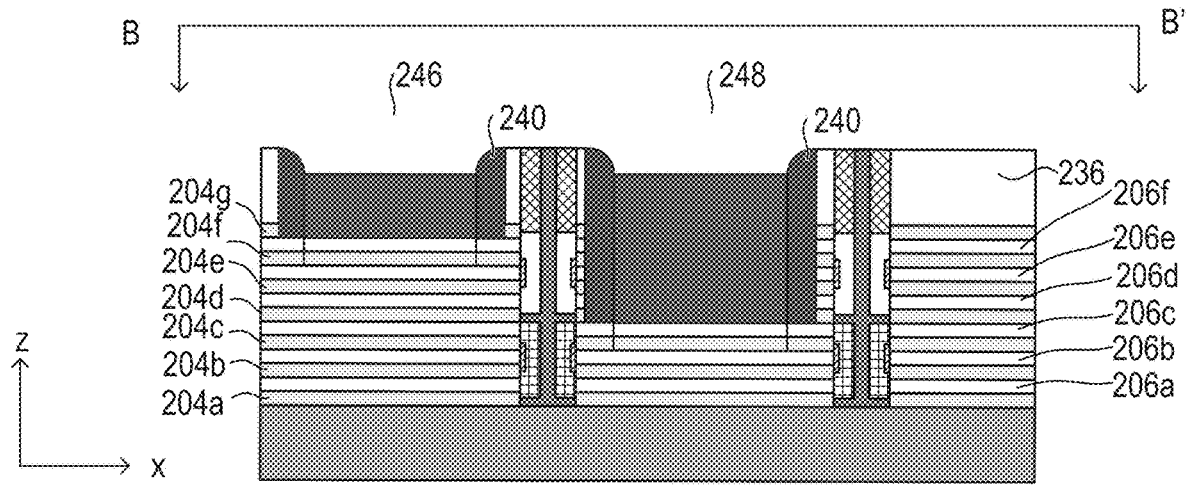

In FIGS. 25A, 25B, and 25C, a directional etching can be executed to remove the bottom portions of the first dielectric structure 240 in the contact openings 242 and 244. The direction etching can further extend through the insulating layer 204f and the interconnect layer 206f in the contact opening 242 and the insulating layer 204c and the interconnect layer 206c in the contact opening 244. Accordingly, a contact opening 246 can be formed based on the contact opening 242 and a contact opening 248 can be formed based on the contact opening 244. The interconnect layer 206e can be uncovered in the contact opening 246 and the interconnect layer 206b can be uncovered in the contact opening 248.

Figure 26A:
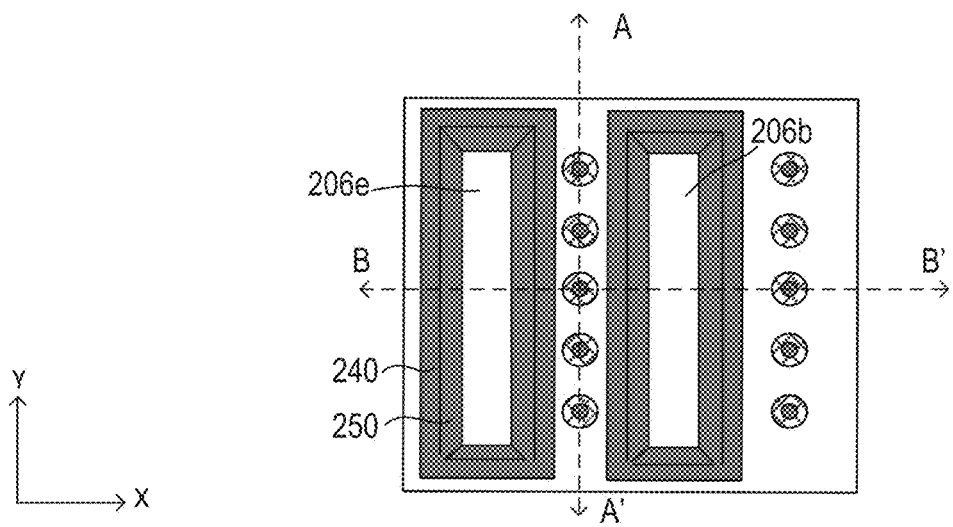
Figure 26B:
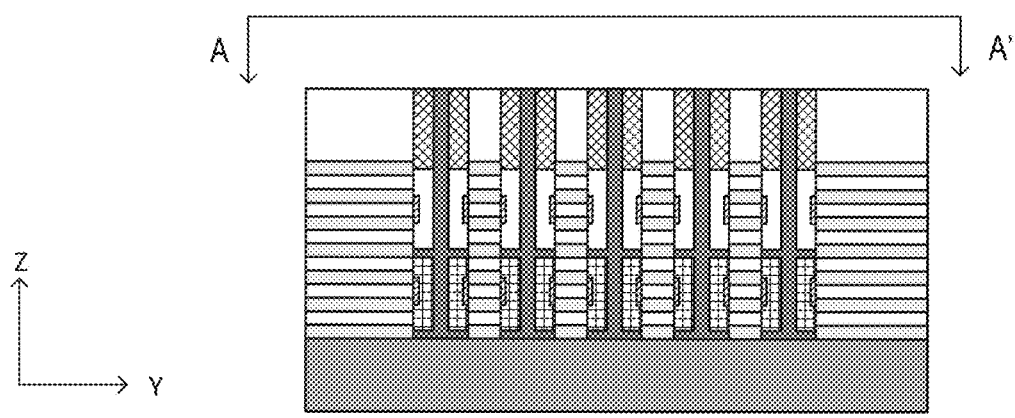
Figure 26C:
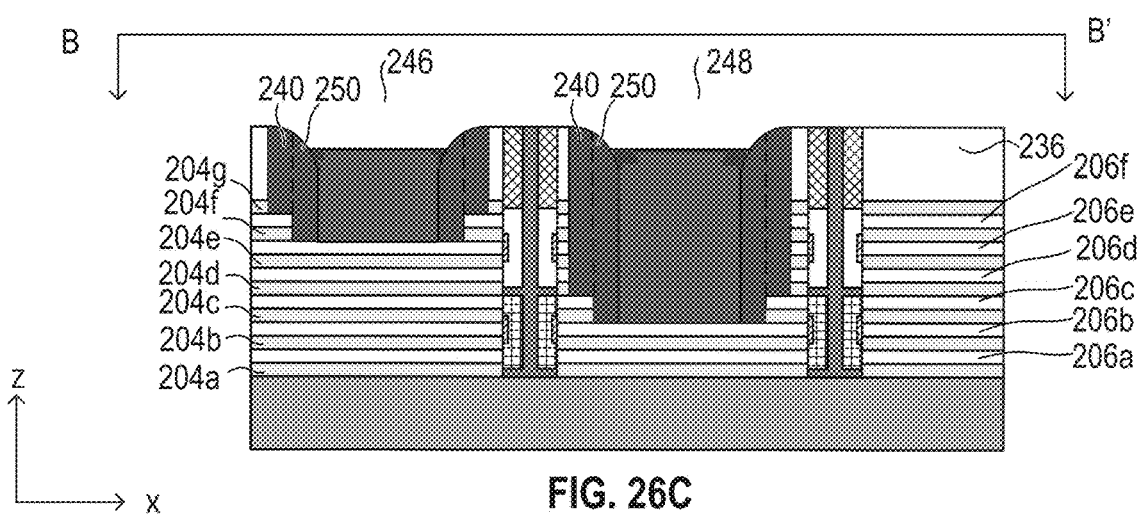

In FIG. 26A, a second dielectric structure 250 can be formed in contact openings 246 and 248. The second dielectric structure 250 can have side portions formed along sidewalls of the contact openings 246 and 248, bottom portions over the interconnect layer 206e in the contact opening 246 and over the interconnect layer 206b in the contact opening 248. A directional etching can be subsequently applied to remove the bottom portions of the second dielectric structure 250 that are positioned over the interconnect layer 206e in the contact opening 246 and over the interconnect layer 206b in the contact opening 248. Accordingly, the interconnect layers 206e and 206b can be exposed in the contact openings 246 and 248 respectively.

Figure 27A:
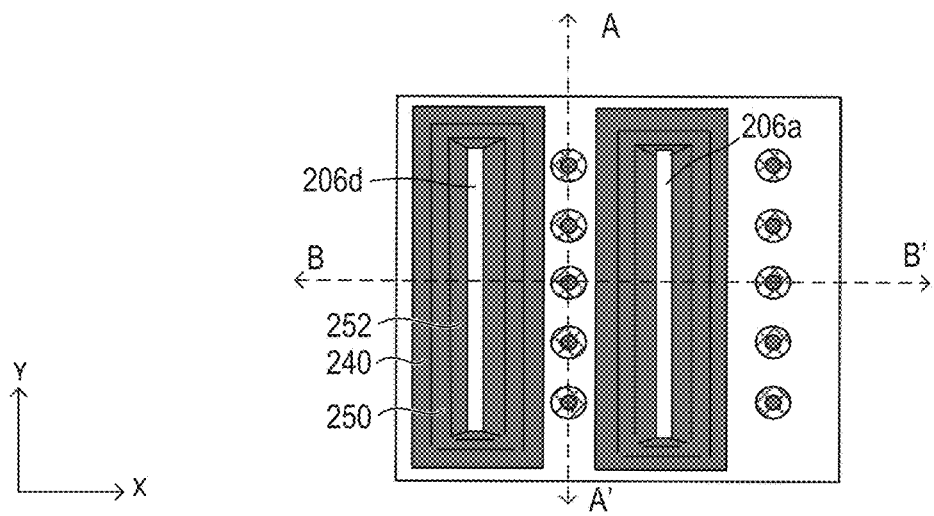
Figure 27B:
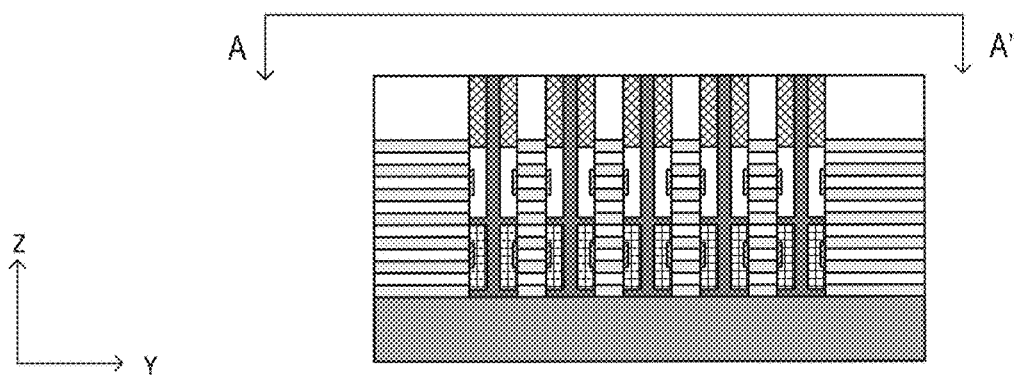
Figure 27C:
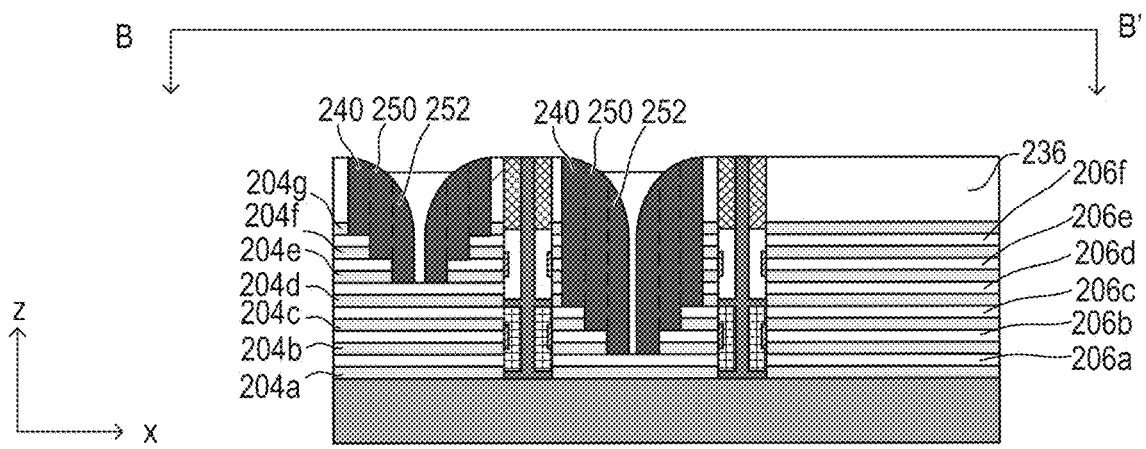

In FIGS. 27A, 27B, and 27C, a pair of insulating layer (e.g., 204e) and interconnect layer (e.g., 206e) uncovered in the contact opening 246, and a pair of insulating layer (e.g., 204b) and interconnect layer (e.g., 206b) uncovered the contact opening 248 can be removed by a directional etching by using the first dielectric structure 240 and the second dielectric structure 250 as an etching mask. Accordingly, the interconnect layers 206d and 206a can be uncovered. Further, a third dielectric structure 252 can be formed along sidewalls of the second dielectric structure 250 and over the interconnect layer 206d and over the interconnect layer 206a respectively. Portions of the third dielectric structure 252 that are positioned over the interconnect layer 206d and the interconnect layer 206a can be etched away, and the interconnect layer 206d and the interconnect layer 206a can be uncovered accordingly.

Figure 28A:
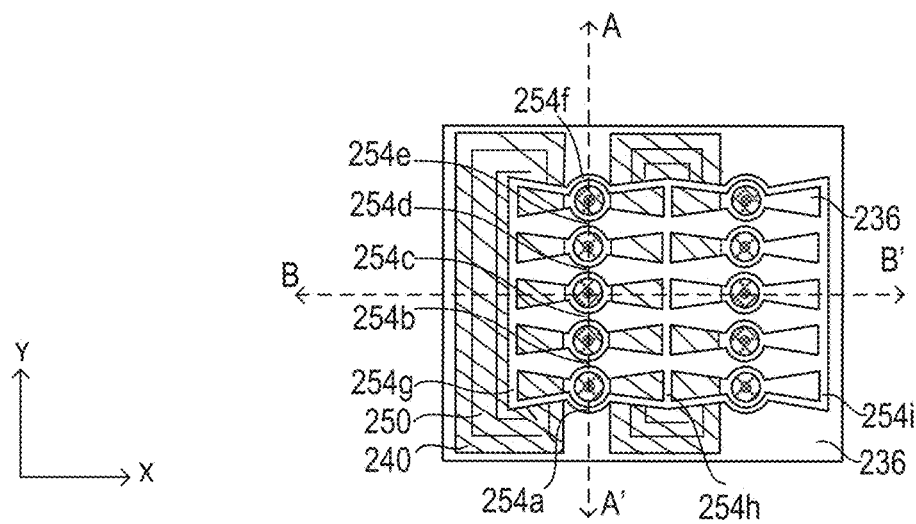
Figure 28B:
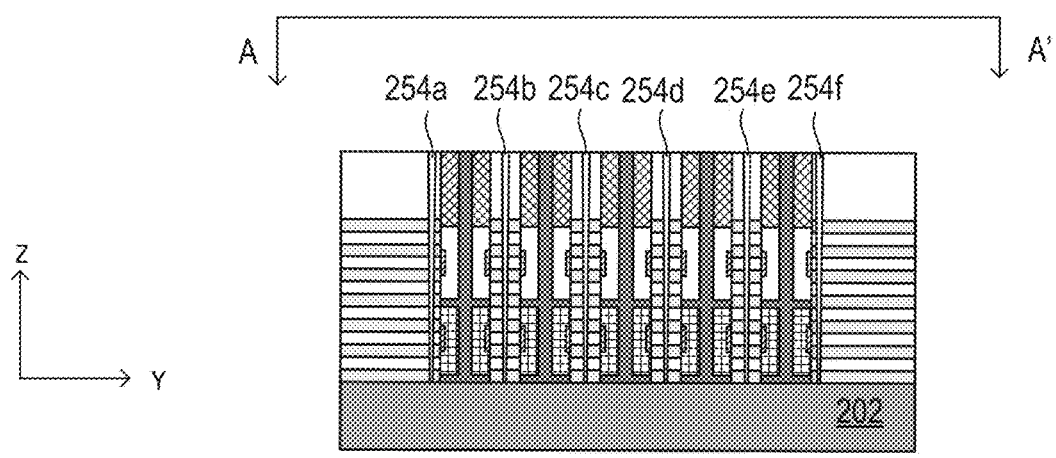
Figure 28C:
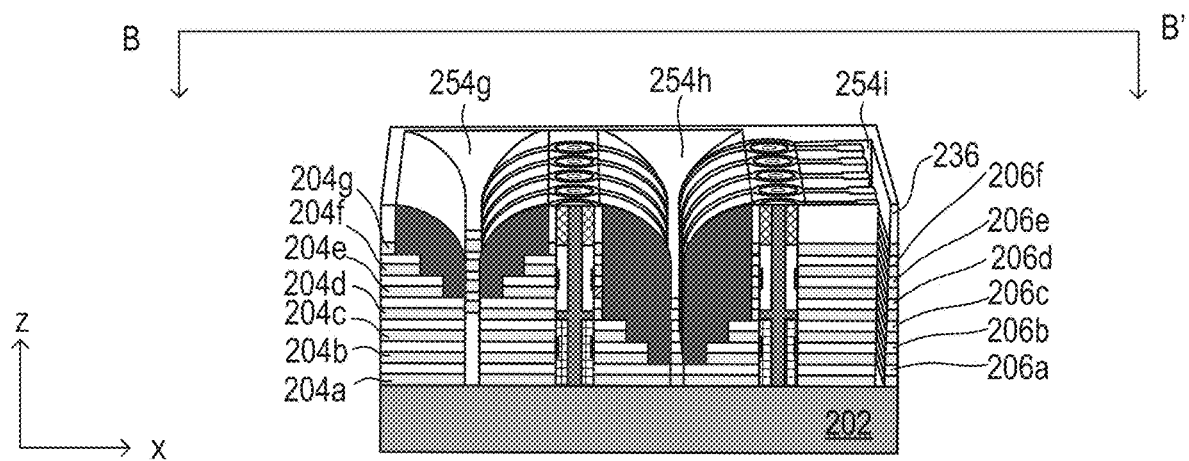

In FIGS. 28A, 28B, and 28C, a direction etching can be performed to form device separation openings (e.g., 254a-254f and 254i) and the contact openings (e.g., 254g and 254h). The device separation openings (e.g., 254a-254f and 254i) and the contact openings (e.g., 254g and 254h) can extend from the substrate 202 and through the cap layer 236, the insulating layers 204a-204g, and the interconnect layers 206a-206f.

Figure 29A:
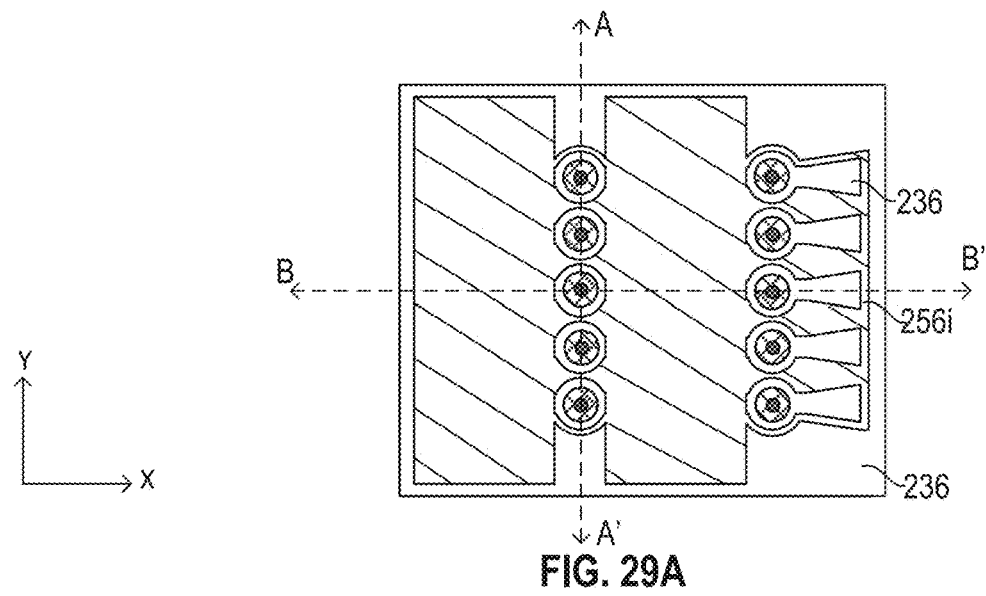
Figure 29B:
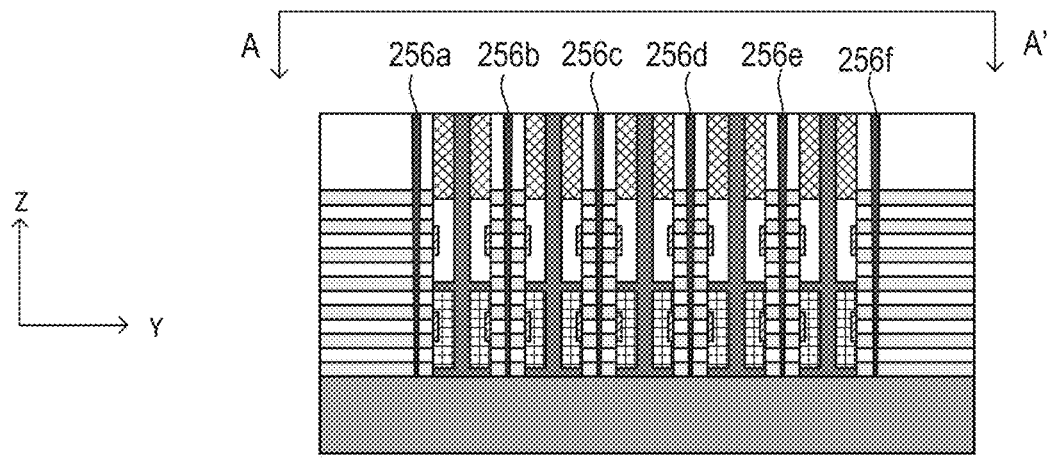
Figure 29C:
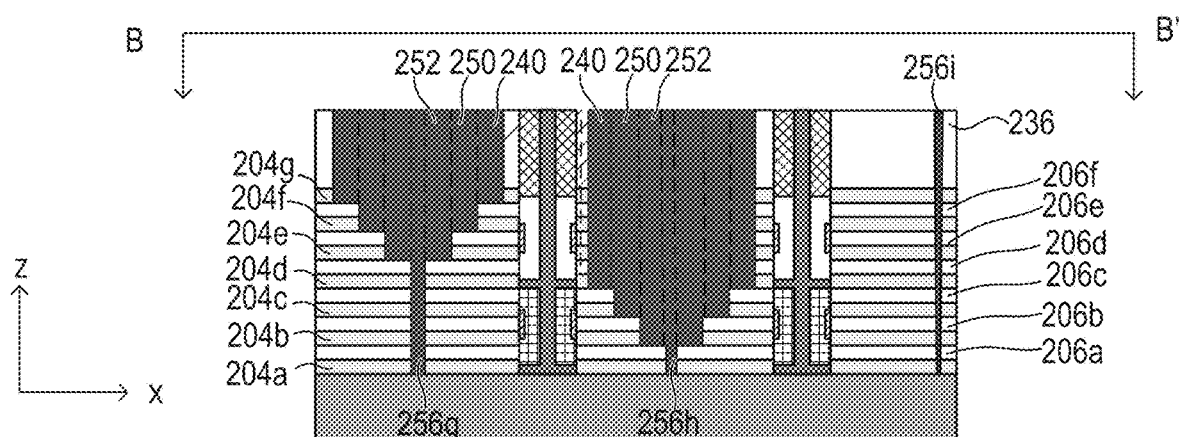

In FIGS. 29A, 29B, and 29C, the device separation openings (e.g., 254a-254f and 254i) and the contact openings (e.g., 254g and 254h) can be filled with a dielectric material to form device separation structures (e.g., 256a-256f and 256i) and dummy contacts (e.g., 256g and 256h). A CMP can be applied after the deposition of the dielectric material to remove overburden of the deposition. In some embodiments, the dielectric material can be the same dielectric material that is applied to form the first, second, and third dielectric structures 240, 250, and 252.

Figure 30A:
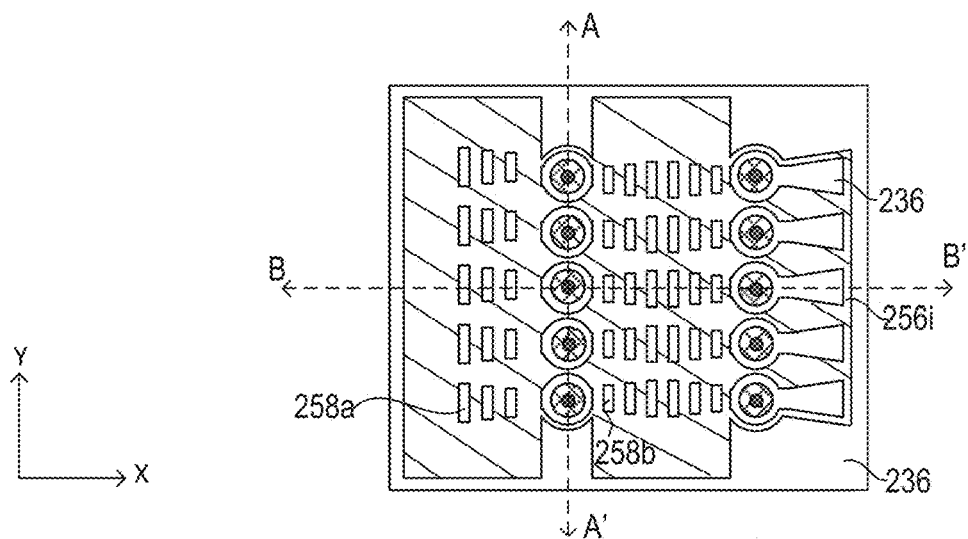
Figure 30B:
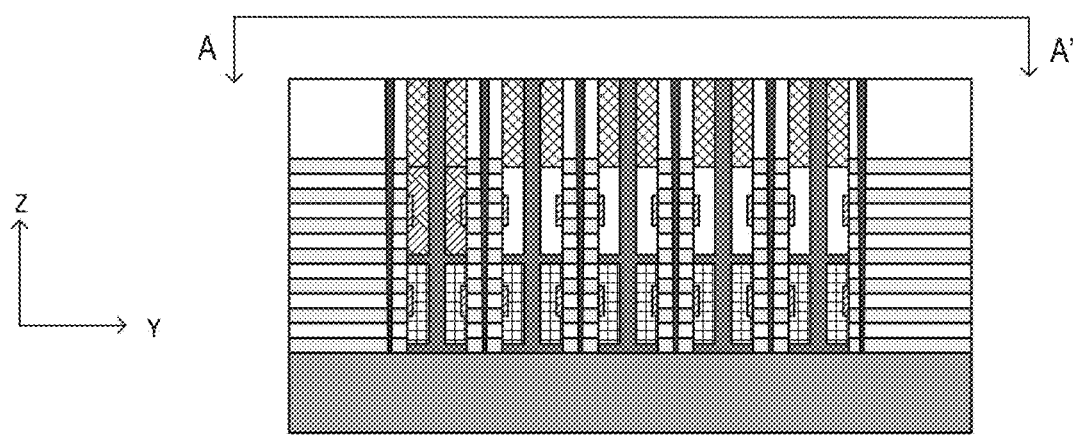
Figure 30C:
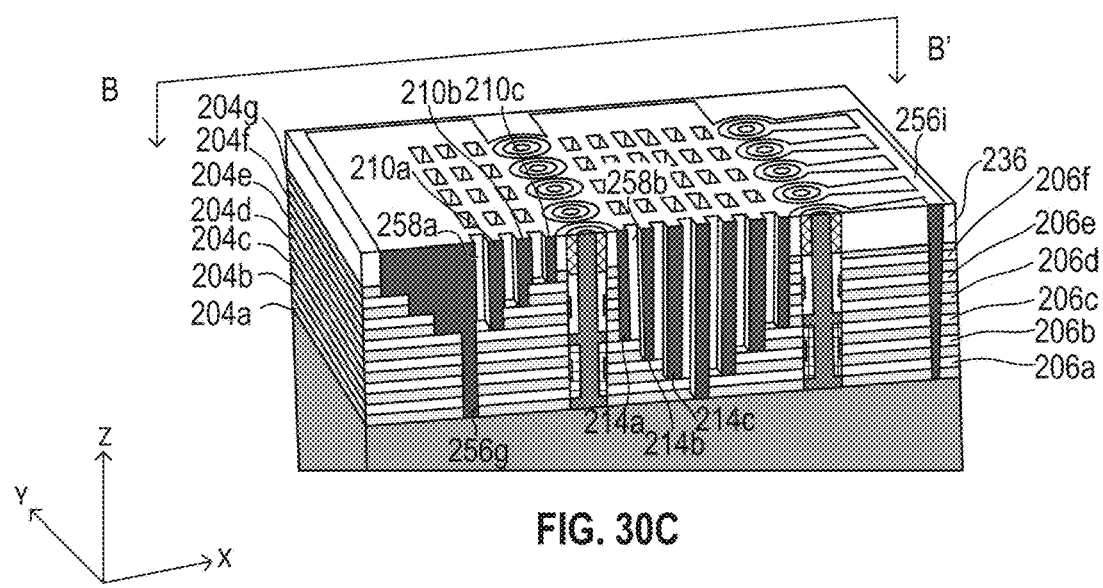

In FIGS. 30A, 30B, and 30C, a patterning process can be applied. The patterning process can include a photolithographic process to form patterned mask and a directional etching. The patterned mask can include patterns that uncover portions of the first, second, and third dielectric structures 240, 250, and 252. The directional etching can transfer the patterns of the patterned mask into the cap layer 236 and the stack of the insulating layers 204a-204g and the interconnect layers 206a-206f to form a plurality of metal contact openings (or openings) 258. The openings 258 can uncover the interconnect layers 206a-206f. For example, the opening 258a can uncover the interconnect layer 206d, and the opening 258b can uncover the interconnect layer 206c. In addition, the remaining of the first, second, and third dielectric structures 240, 250, and 252 can become spacers. For example, spacers 210a-201c and spacers 214a-3214c are provided in FIG. 30C, which are arranged with the openings 258 alternatingly along the X direction.

Figure 31A:
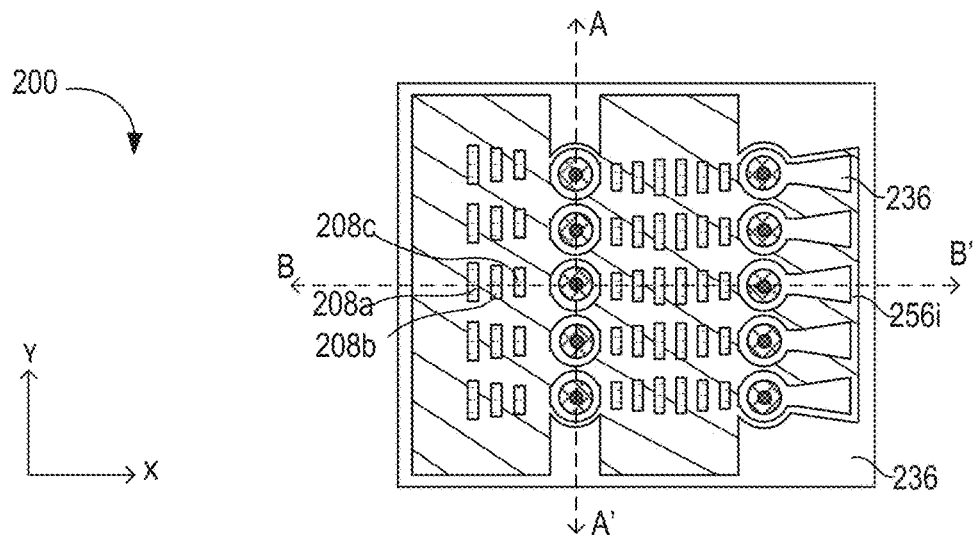
Figure 31B:
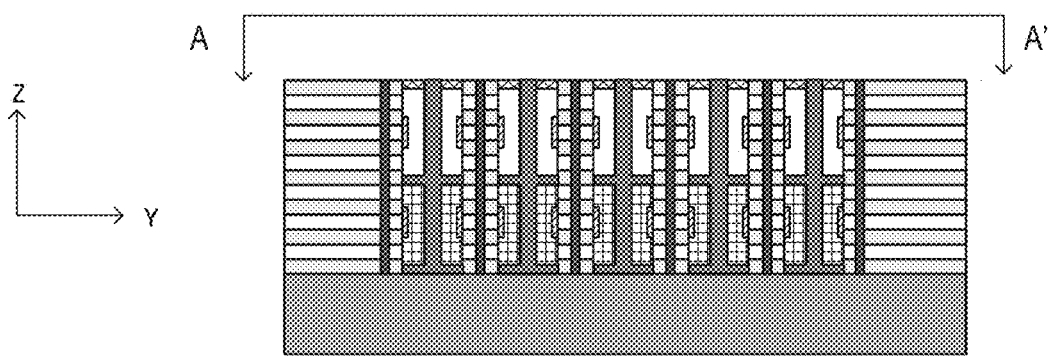
Figure 31C:
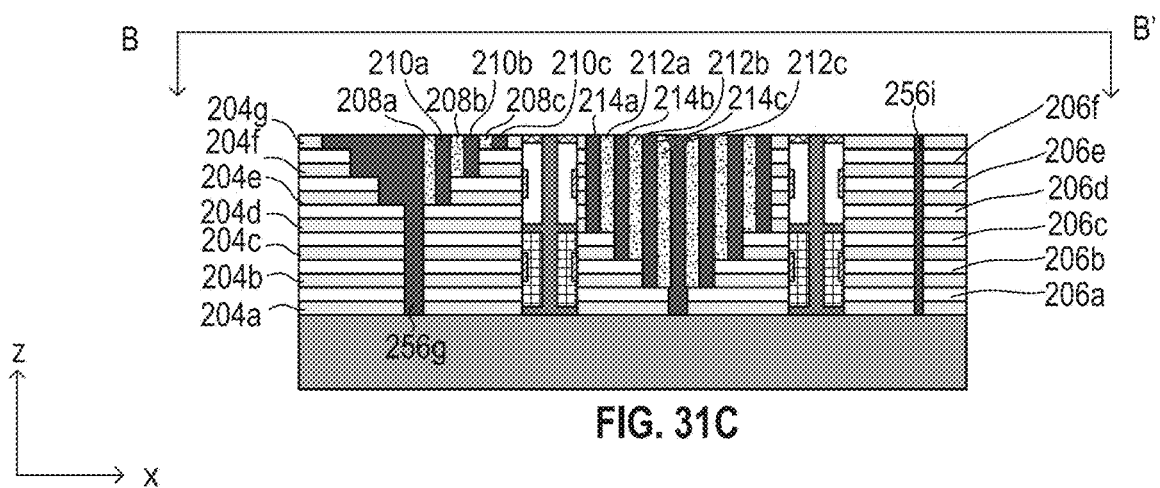

In FIGS. 31A, 31B, and 31C, the metal contact openings 258 can be filled with a conductive material, such as W, Co, Ru, or the like. Further, overburden of the conductive material deposition can be removed by a CMP process. Accordingly, the conductive material remaining in the metal contact openings 258 can become the contact structures. For example, the contact structures 208a-208c and the 212a-212c can be formed in the metal contact openings 258. The contact structures can extend from and be coupled to the interconnect layers in a staircase configuration such that each of the plurality of contact structures extends from a respective interconnect layer. When the formation of the contact structures are completed, a semiconductor device 200 can be formed accordingly. The semiconductor device 200 can have similar features to the device 200 in FIG. 23.

Figure 32:
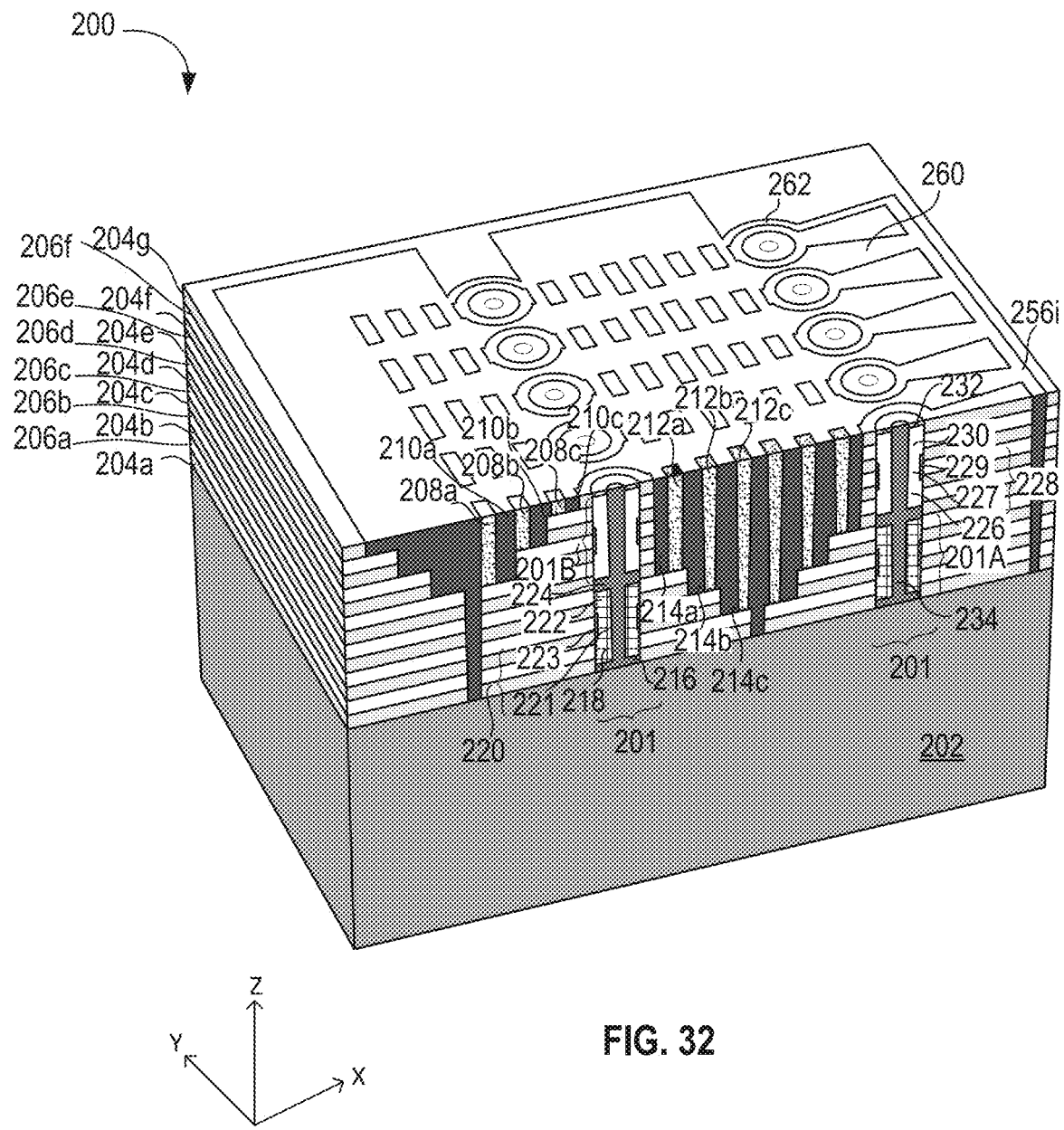

FIG. 32 illustrates a perspective view of the semiconductor device 200 that is formed based on the device fabrication process starting with FIGS. 24A, 24B, and 24C. The semiconductor device shown in FIG. 32 can have similar features to the device shown in FIG. 23. Note a circular ring and polygon reticle around the device 200 can be applied to form circular separation structures (e.g., 262) and polygon-shaped separation structures (e.g., 260) to separate the device from other devices or other structures that are also formed over the substrate 202. In the device fabrication process mentioned above, a final lithography mask (e.g., the mask applied to form the metal contact openings 258 in FIG. 30) can be used to open spaces (e.g., metal contact openings 258) for different metal contacts (e.g., the interconnect layers 206) for Drain (e.g., first S/D region 218), Gate (e.g., first gate region 220) and Source (e.g., second S/D region 222) by etching a single dielectric (e.g., the first dielectric structure 240). One advantage of the technique is the freedom to put contacts in wide directions.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding.

Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
    a stack of insulating layers and interconnect layers that are positioned alternatingly over a substrate;
    a channel structure extending from the substrate and further through the insulating layers and the interconnect layers, the channel structure including a first channel section positioned over the substrate and coupled to a first group of the interconnect layers, and a second channel section positioned over the first channel section and coupled to a second group of the interconnect layers; and
    a plurality of contact structures extending from and coupled to the interconnect layers in a staircase configuration such that each of the plurality of contact structures extends from a respective interconnect layer, wherein the first channel section comprises:
    a first S/D region formed over the substrate;
    a first gate region formed over the first S/D region, the first gate region including a first channel region over the first S/D region and a first gate oxide around the first channel region; and
    a second S/D region over the first gate region.

2. The semiconductor device of claim 1, wherein the first group of the interconnect layers further comprises:
    a first interconnect layer that is in contact with the first S/D region of the first channel section and over the substrate;
    a second interconnect layer that is in contact with the first gate oxide of the first gate region of the first channel region and over the first interconnect layer; and
    a third interconnect layer that is in contact with the second S/D region of the first channel section and over the second interconnect layer.

3. The semiconductor device of claim 2, wherein the second channel section further comprises:
    a third S/D region formed over the second S/D region of the first channel section;
    a second gate region formed over the third S/D region, the second gate region including a second channel region over the third S/D region and a second gate oxide around the second channel region; and
    a fourth S/D region over the second gate region.

4. The semiconductor device of claim 3, wherein the second group of the interconnect layers further comprises:
    a fourth interconnect layer that is in contact with the third S/D region of the second channel section and over the third interconnect layer;
    a fifth interconnect layer that is in contact with the second gate oxide of the second gate region and over the fourth interconnect layer; and
    a sixth interconnect layer that is in contact with the fourth S/D region of the second channel section and over the fifth interconnect layer.

5. The semiconductor device of claim 3, wherein the third S/D region, the second channel region, and the fourth S/D region of the second channel section include one of a p-type semiconductor material and a n-type semiconductor material.

6. The semiconductor device of claim 3, wherein the channel structure further comprises:
    a first dielectric layer positioned between the substrate and the first S/D region of the first channel section;
    a second dielectric layer positioned between the second S/D region of the first channel section and the third S/D region of the second channel section; and
    a third dielectric layer positioned over the fourth S/D region of the second channel section.

7. The semiconductor device of claim 6, wherein the channel structure further comprises:
    an isolation structure extending from the first dielectric layer and further through the first channel section, the second dielectric layer, the second channel section, and the third dielectric layer.

8. The semiconductor device of claim 1, wherein the first S/D region, the first channel region, and the second S/D region of the first channel section include one of a p-type semiconductor material and a n-type semiconductor material.

9. The semiconductor device of claim 1, further comprising:
    a plurality of spacers extending from the interconnect layers and positioned between the plurality of contact structures such that the plurality of spacers and the plurality of contact structures are disposed alternatingly along a direction parallel to the substrate.

10. The semiconductor device of claim 1, wherein the first channel section and the second channel section are spaced apart and electrically isolated from each other.

11. A method for fabricating a semiconductor device, the method comprising:
    forming a channel structure on a substrate, the channel structure extending from the substrate and further through a stack of alternating insulating layers and interconnect layers that are positioned over the substrate, the channel structure being channels of field effect transistors that have a current flow path perpendicular to a surface of the substrate;

forming a plurality of bilayer dielectric structures extending from the interconnect layers in a staircase configuration such that each of the plurality of bilayer dielectric structures extends from a respective interconnect layer along a direction perpendicular to the substrate, each of the bilayer dielectric structures including a respective first dielectric layer and a respective second dielectric layer such that the first dielectric layers and the second dielectric layers in the plurality of bilayer dielectric structures are disposed alternatingly along a direction parallel to the substrate; and forming a plurality of contact structures by replacing the second dielectric layers with a conductive material, the contact structures extending from and coupled to the interconnect layers in a staircase configuration such that each of the plurality of contact structures extends from a respective interconnect layer.

12. The method of claim 11, wherein the forming the plurality of bilayer dielectric structures comprises:

forming a first opening in the stack adjacent to the channel structure, the first opening including sidewalls and a bottom to uncover a first interconnect layer of the stack;

forming a first bilayer dielectric structure of the plurality of bilayer dielectric structures that has side portions along the sidewalls of the first opening and a bottom portion over the first interconnect layer;

etching (i) the bottom portion of the first bilayer dielectric structure and (ii) the first interconnect layer and a first insulating layer underlying the first interconnect layer in the first opening to form a second opening that includes sidewalls along the first bilayer dielectric structure and a bottom to uncover a second interconnect layer underlying the first insulating layer;

forming a second bilayer dielectric structure that has side portions along the sidewalls of the second opening and a bottom portion over the second interconnect layer;

etching (i) the bottom portion of the second bilayer dielectric structure and (ii) the second interconnect layer and a second insulating layer underlying the second interconnect layer in the second opening to form a third opening that includes sidewalls along the second bilayer dielectric structure and a bottom to uncover a third interconnect layer underlying the second insulating layer; and forming a third bilayer dielectric structure that has side portions along the sidewalls of the third opening and a bottom portion over the third interconnect layer, and removing the bottom portion of the third bilayer dielectric structure.

13. The method of claim 12, wherein the forming the plurality of contact structures further comprises:

replacing the second dielectric layers in the first, second, and third bilayer dielectric structures with the conductive material to form a first contact structure, a second contact structure, and a third contact structure of the plurality of contact structures respectively.

14. The method of claim 13, wherein the forming the channel structure further comprises:

forming a bottom dielectric layer over the substrate;

forming a first channel section over the bottom dielectric layer;

forming a middle dielectric layer over the first channel section;

forming a second channel section over the middle dielectric layer; and forming a top dielectric layer over the second channel section.

15. The method of claim 14, wherein the first channel section further comprises:

a first S/D region formed over the bottom dielectric layer and in contact with the third interconnect layer;

a first gate region formed over the first S/D region, the first gate region including a first channel region over the first S/D region and a first gate oxide that is around the first channel region and in contact with the second interconnect layer; and a second S/D region over the first gate region and in contact with the first interconnect layer.

16. The method of claim 15, wherein the second channel section further comprises:

a third S/D region formed over the second S/D region of the first channel section;

a second gate region formed over the third S/D region, the second gate region including a second channel region over the third S/D region and a second gate oxide around the second channel region; and a fourth S/D region over the second gate region.

17. A method for fabricating a semiconductor device, the method comprising:

forming a channel structure on a substrate, the channel structure extending from the substrate and further through a stack of alternating insulating layers and interconnect layers that are positioned over the substrate, the channel structure being channels of field effect transistors that have a current flow path perpendicular to a surface of the substrate;

forming a plurality of dielectric structures extending from the interconnect layers in a staircase configuration such that each of the dielectric structures extends from a respective interconnect layer along a direction perpendicular to the substrate;

forming a plurality of contact openings in the plurality dielectric structures such that each of the plurality of contact openings uncovers a respective interconnect layer of the interconnect layers; and forming a plurality of contact structures by filling the plurality of contact openings with a conductive material, the contact structures extending from and coupled to the interconnect layers in a staircase configuration such that each of the plurality of contact structures extends from a respective interconnect layer.

18. The method of claim 17, wherein the forming the plurality of dielectric structures comprises:

forming a first opening in the stack adjacent to the channel structure, the first opening including sidewalls and a bottom to uncover a first interconnect layer of the stack;

forming a first dielectric structure of the plurality of dielectric structures that includes side portions along the sidewalls of the first opening and a bottom portion over the first interconnect layer;

etching (i) the bottom portion of the first dielectric structure and (ii) the first interconnect layer and a first insulating layer underlying the first interconnect layer in the first opening to form a second opening that includes sidewalls along the first dielectric structure and a bottom to uncover a second interconnect layer underlying the first insulating layer;

forming a second dielectric structure that includes side portions along the sidewalls of the second opening and a bottom portion over the second interconnect layer;

etching (i) the bottom portion of the second dielectric structure and (ii) the second interconnect layer and a second insulating layer underlying the second interconnect layer in the second opening to form a third opening that includes sidewalls along the second dielectric structure and a bottom to uncover a third interconnect layer underlying the second insulating layer; and forming a third dielectric structure that includes side portions along the sidewalls of the third opening and a bottom portion over the third interconnect layer, and removing the bottom portion of the third dielectric structure.

19. The method of claim 18, wherein the forming the plurality of contact openings in the plurality dielectric structures further comprises:

forming a first contact opening of the plurality of contact openings in the first dielectric structure that uncover the first interconnect layer;

forming a second contact opening of the plurality of contact openings in the second dielectric structure that uncover the second interconnect layer; and forming a third contact opening of the plurality of contact openings in the third dielectric structure that uncover the third interconnect layer.

20. The method of claim 19, wherein the forming the channel structure further comprises:

forming a bottom dielectric layer over the substrate;

forming a first channel section over the bottom dielectric layer;

forming a middle dielectric layer over the first channel section;

forming a second channel section over the middle dielectric layer; and forming a top dielectric layer over the second channel section, wherein the first channel section further comprises:

a first S/D region formed over the bottom dielectric layer and in contact with the third interconnect layer;

a first gate region formed over the first S/D region, the first gate region including a first channel region over the first S/D region and a first gate oxide that is around the first channel region and in contact with the second interconnect layer; and a second S/D region over the first gate region and in contact with the first interconnect layer.

\* \* \* \* \*